(12) United States Patent
Yoshida et al.

(10) Patent No.: US 11,810,930 B2
(45) Date of Patent: Nov. 7, 2023

(54) IMAGING DEVICE, IMAGING SYSTEM, AND MOVING BODY

(71) Applicant: CANON KABUSHIKI KAISHA, Tokyo (JP)

(72) Inventors: Daisuke Yoshida, Ebina (JP); Takahiro Shirai, Isehara (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/685,980

(22) Filed: Mar. 3, 2022

(65) Prior Publication Data

US 2022/0254817 A1  Aug. 11, 2022

Related U.S. Application Data

(63) Continuation of application No. 16/909,786, filed on Jun. 23, 2020, now Pat. No. 11,282,876, which is a
(Continued)

(30) Foreign Application Priority Data

Feb. 9, 2018  (JP) .................................. 2018-022403

(51) Int. Cl.
| | |
|---|---|
| *H01L 21/00* | (2006.01) |
| *H01L 27/146* | (2006.01) |
| *H04N 25/75* | (2023.01) |
| *H04N 25/79* | (2023.01) |
| *H04N 25/771* | (2023.01) |
| *H04N 25/772* | (2023.01) |

(52) U.S. Cl.
CPC .... *H01L 27/1461* (2013.01); *H01L 27/14607* (2013.01); *H04N 25/75* (2023.01); *H04N 25/771* (2023.01); *H04N 25/772* (2023.01); *H04N 25/79* (2023.01)

(58) Field of Classification Search
CPC .......... H01L 27/1461; H01L 27/14607; H04N 25/75
See application file for complete search history.

(56) References Cited

U.S. PATENT DOCUMENTS

| | | | | | |
|---|---|---|---|---|---|
| 5,521,990 A | * | 5/1996 | Ishizawa | ................. | G06T 11/60 382/270 |
| 5,991,223 A | * | 11/1999 | Kozaru | ................ | G11C 7/1018 365/233.17 |

(Continued)

FOREIGN PATENT DOCUMENTS

| | | |
|---|---|---|
| CN | 101569179 A | 10/2009 |
| EP | 2889908 A1 | 7/2015 |

(Continued)

*Primary Examiner* — Laura M Menz
(74) *Attorney, Agent, or Firm* — CANON U.S.A., INC. IP Division

(57) ABSTRACT

An imaging device includes a first transmission line connected to a plurality of bit memories, a plurality of second bit memories disposed outside the memory area, and connected to the first transmission line, and each are configured to hold a digital signal of one bit that is one of different bits among a plurality of bits, a second transmission line connected to a part of the plurality of second bit memories, and a third transmission line connected to another part of the plurality of second bit memories.

49 Claims, 15 Drawing Sheets

Related U.S. Application Data continuation of application No. 16/268,358, filed on Feb. 5, 2019, now Pat. No. 10,727,259.

(56) References Cited

U.S. PATENT DOCUMENTS

| | | | | |
|---|---|---|---|---|
| 6,154,157 | A * | 11/2000 | Wong | G06J 1/00 341/110 |
| 6,169,503 | B1 * | 1/2001 | Wong | H03M 1/361 341/136 |
| 6,498,851 | B1 * | 12/2002 | Wong | H04K 1/00 380/276 |
| 6,976,200 | B1 * | 12/2005 | Ohbayashi | G11C 29/32 257/773 |
| 8,908,075 | B2 * | 12/2014 | Silverbrook | B41J 2/1433 348/222.1 |
| 9,448,109 | B2 * | 9/2016 | Kameyama | G01J 1/44 |
| 9,654,716 | B2 * | 5/2017 | Hayashi | H04N 25/68 |
| 10,158,820 | B2 * | 12/2018 | Yanai | H04N 25/75 |
| 10,727,259 | B2 * | 7/2020 | Yoshida | H04N 25/771 |
| 10,798,329 | B2 * | 10/2020 | Kobayashi | H04N 25/772 |
| 10,812,748 | B2 * | 10/2020 | Yoshida | H04N 25/575 |
| 10,834,354 | B2 * | 11/2020 | Kobayashi | H04N 25/745 |
| 11,140,348 | B2 * | 10/2021 | Totsuka | H04N 25/75 |
| 11,282,876 | B2 * | 3/2022 | Yoshida | H04N 25/772 |
| 11,405,570 | B2 * | 8/2022 | Totsuka | H04N 25/778 |
| 11,424,282 | B2 * | 8/2022 | Nakamura | H01L 27/14634 |
| 2003/0043133 | A1 * | 3/2003 | Tzelnick | G06T 1/0007 345/204 |
| 2009/0256735 | A1 * | 10/2009 | Bogaerts | H03M 1/1019 341/169 |
| 2010/0214462 | A1 * | 8/2010 | Itakura | H04N 25/75 348/E5.091 |
| 2010/0289931 | A1 * | 11/2010 | Shibata | H04N 25/76 348/294 |
| 2011/0205100 | A1 * | 8/2011 | Bogaerts | H04N 25/768 341/169 |
| 2012/0113290 | A1 * | 5/2012 | Nakata | H04N 25/75 348/E5.037 |
| 2013/0021493 | A1 * | 1/2013 | Ishibashi | H04N 25/00 348/222.1 |
| 2016/0116333 | A1 * | 4/2016 | Kameyama | G01J 1/44 341/156 |
| 2016/0156865 | A1 * | 6/2016 | Hayashi | H03M 1/123 348/302 |
| 2018/0288349 | A1 * | 10/2018 | Yoshida | H03M 1/56 |
| 2019/0252421 | A1 * | 8/2019 | Yoshida | H04N 25/75 |
| 2019/0394416 | A1 * | 12/2019 | Kobayashi | H04N 25/62 |
| 2020/0059619 | A1 * | 2/2020 | Totsuka | H04N 25/74 |
| 2020/0321366 | A1 * | 10/2020 | Yoshida | H04N 25/771 |
| 2020/0389617 | A1 * | 12/2020 | Totsuka | H01L 27/14612 |
| 2022/0247966 | A1 * | 8/2022 | Ochiai | H04N 25/79 |
| 2022/0254817 | A1 * | 8/2022 | Yoshida | H04N 25/79 |
| 2022/0321820 | A1 * | 10/2022 | Kobayashi | H01L 27/14609 |

FOREIGN PATENT DOCUMENTS

| | | | | |
|---|---|---|---|---|
| EP | 3 032 822 | A1 | 6/2016 | |
| EP | 3525452 | A1 * | 8/2019 | G08G 1/16 |
| JP | 2017-192056 | A | 10/2017 | |
| JP | 2019140534 | A * | 8/2019 | G08G 1/16 |
| WO | 2004045204 | A1 | 5/2004 | |
| WO | 2016/151837 | A1 | 9/2016 | |
| WO | WO-2017130728 | A1 * | 8/2017 | H01L 21/76 |
| WO | 2017/169480 | A1 | 10/2017 | |

* cited by examiner

FRONT VIEW

TOP VIEW

REAR VIEW

IMAGING DEVICE, IMAGING SYSTEM, AND MOVING BODY

CROSS-REFERENCE TO RELATED APPLICATION

This application is a Continuation of U.S. application Ser. No. 16/909,786, filed Jun. 23, 2020, which is a Continuation of U.S. application Ser. No. 16/268,358, filed Feb. 5, 2019, which claims priority from Japanese Patent Application No. 2018-022403, filed Feb. 9, 2018, which are hereby incorporated by reference herein in their entireties.

BACKGROUND OF THE INVENTION

Field of the Invention

The present invention relates to an imaging device, an imaging system, and a moving body.

Description of the Related Art

Japanese Patent Application Laid-Open No. 2014-165733 discusses an imaging device that includes an analog-to-digital (AD) conversion unit that performs AD conversion of a signal of a photoelectric conversion unit. In this imaging device, the AD conversion units are arranged in a plurality of rows and a plurality of columns.

In the imaging device discussed in Japanese Patent Application Laid-Open No. 2014-165733, the AD conversion units in one column are connected to one vertical bus. This vertical bus is connected to a signal holding unit provided corresponding to each column. Digital signals are sequentially transmitted from the signal holding unit of each column to an output unit.

SUMMARY OF THE INVENTION

According to an aspect of the present invention, an imaging device includes a plurality of photoelectric conversion units arranged in a plurality of rows and a plurality of columns, a memory area in which a plurality of first bit memories is arranged in a plurality of rows and a plurality of columns, the first bit memories each holding a digital signal of one bit, and the one bit being one of different bits of a digital signal that is formed of a plurality of bits and generated by analog-to-digital (AD) conversion of a signal based on a signal generated by the corresponding photoelectric conversion unit among the plurality of photoelectric conversion units, a first transmission line disposed to correspond to a plurality of first bit memories in one column of the plurality of columns, and extending from the memory area to outside the memory area, the first transmission line being connected to the plurality of first bit memories in the one column, a plurality of second bit memories disposed outside the memory area, and connected to the first transmission line, the second bit memories each being configured to hold the digital signal of one bit that is one of different bits among the plurality of bits, a second transmission line connected to a part of the plurality of second bit memories, and a third transmission line connected to another part of the plurality of second bit memories.

Further features of the present invention will become apparent from the following description of exemplary embodiments with reference to the attached drawings.

DESCRIPTION OF THE EMBODIMENTS

Japanese Patent Application Laid-Open No. 2014-165733 discusses an imaging device, but discusses nothing about bit memories each of which holds one different bit of a digital signal formed of a plurality of bits, and nothing about a connection configuration for a transmission line for transmitting the digital signal.

A technique to be described below relates to a technique for speeding up transmission of a digital signal formed of a plurality of bits, while inhibiting an increase in the number of wiring lines of a transmission line.

Exemplary embodiments will be described below with reference to the drawings.

Figure 1A:
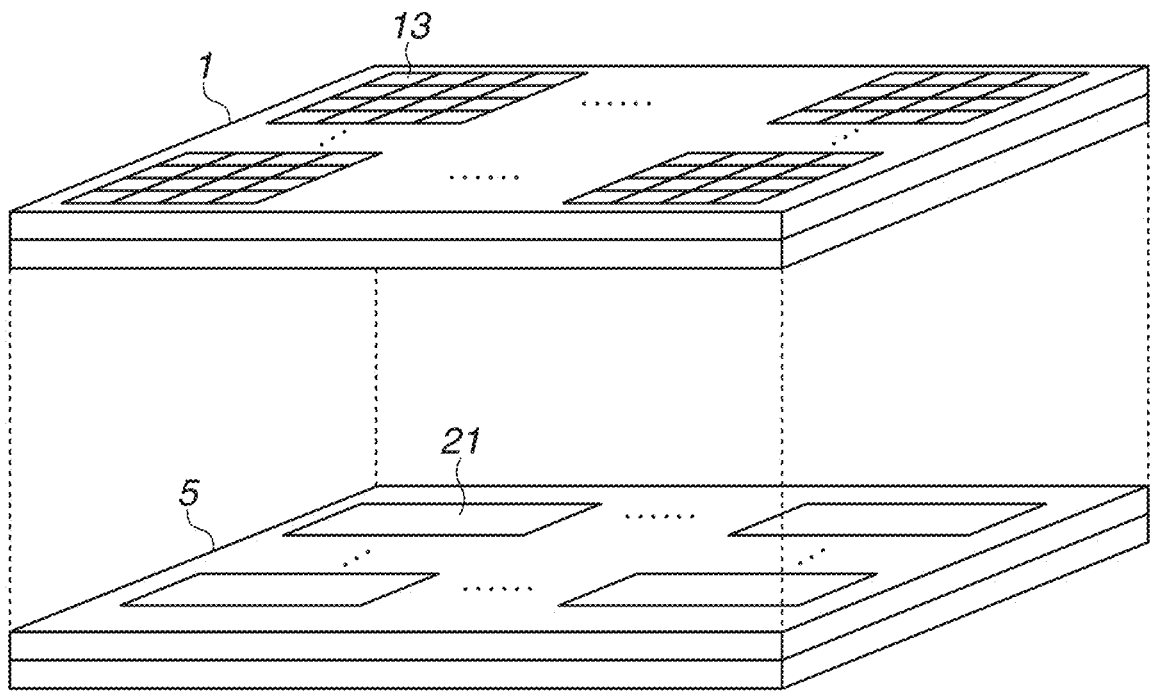
FIGS. 1A and 1B are a schematic diagram and a cross-sectional diagram, respectively, illustrating a configuration of an imaging device.

FIG. 1A is a diagram illustrating a first chip 1 and a second chip 5 included in an imaging device according to a first exemplary embodiment. In the first chip 1, photoelectric conversion units 13 are arranged in a plurality of rows and a plurality of columns. Further, in the second chip 5, analog-to-digital (AD) conversion units (hereinafter each referred to as "AD converter (ADC)") 21 are arranged in a plurality of rows and a plurality of columns. The ADC 21 performs AD conversion of a signal based on a signal generated by the photoelectric conversion unit 13 into a digital signal formed of a plurality of bits. In FIG. 1A, only the photoelectric conversion unit 13 and the ADC 21 are illustrated. However, other than these units, a control line for controlling the photoelectric conversion unit 13 and a signal line for transmitting a signal based on electric charge accumulated by the photoelectric conversion unit 13 are appropriately disposed in the first chip 1 and the second chip 5.

Further, a vertical scanning circuit and a drive circuit such as a timing generator are appropriately disposed in the first chip 1 or the second chip 5.

Figure 1B:
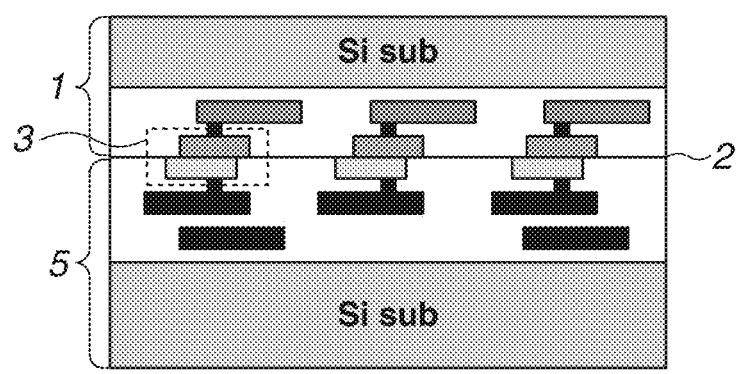

FIG. 1B is a cross-sectional diagram of the first chip 1 and the second chip 5. The first chip 1 and the second chip 5 are connected via a joint plane 2. At the joint plane 2, a wiring line located in the uppermost layer and an insulation layer of the first chip 1 and a wiring line located in the uppermost layer and an insulation layer of the second chip 5 are connected. Cu is typically used for the wiring line. Al can also be used as another example. The wiring line located in the uppermost layer of the first chip 1 and that of the second chip 5 are connected via a connecting portion 3.

Figure 2:
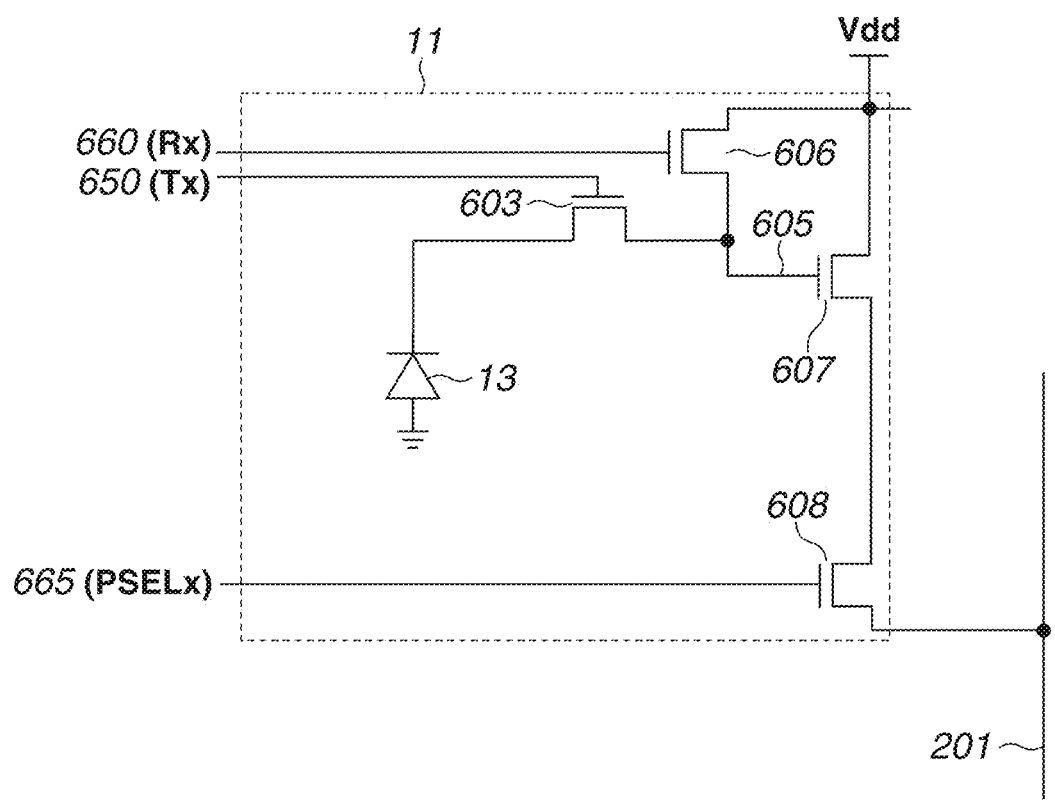
FIG. 2 is an equivalent circuit diagram illustrating a configuration of a pixel.

FIG. 2 is an equivalent circuit diagram of a pixel 11 according to the present exemplary embodiment. The pixel 11 includes a photodiode serving as the photoelectric conversion unit 13. Light passing through a microlens and a color filter (not illustrated) is incident on the photodiode of the pixel 11.

The photodiode is connected to a floating diffusion portion (hereinafter referred to as "FD portion") 605 via a transfer transistor 603. Further, the gate of the transfer transistor 603 is connected to a vertical scanning circuit (not illustrated), via a control line 650. The control line 650 transmits a signal Tx.

The FD portion 605 is connected to a reset transistor 606 and the gate of an amplification transistor 607.

The reset transistor 606 and the amplification transistor 607 are supplied with a power supply voltage Vdd. The gate of the reset transistor 606 is connected to a vertical scanning circuit (not illustrated), via a control line 660. The control line 660 transmits a signal Rx.

The amplification transistor 607 is connected to a selection transistor 608. The gate of the selection transistor 608 is connected to a vertical scanning circuit (not illustrated), via a control line 665. The control line 665 transmits a signal PSELx.

The selection transistor 608 is connected to a signal line 201.

Figure 3:
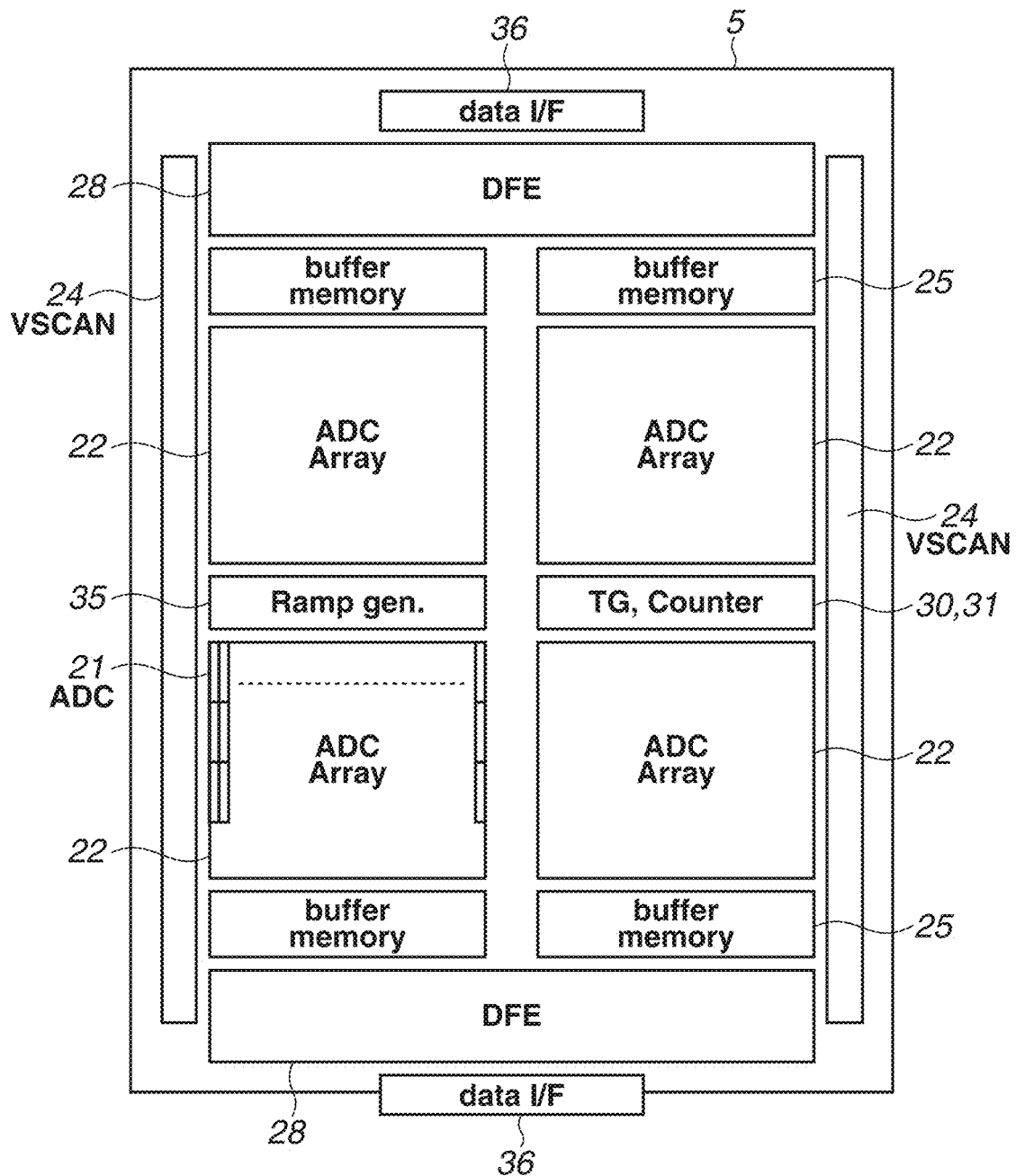
FIG. 3 is a block diagram illustrating a configuration of a second chip.

FIG. 3 is a block diagram illustrating a configuration of the second chip 5 of the imaging device according to the present exemplary embodiment.

The second chip 5 includes an AD conversion region (indicated as "ADC Array" in FIG. 3) 22 where the ADCs 21 are arranged in the plurality of rows and the plurality of columns. The AD conversion regions 22 are also arranged in a plurality of rows and a plurality of columns. A buffer memory 25 is provided corresponding to each of the AD conversion regions 22. The ADC 21 of the AD conversion region 22 and the buffer memory 25 are connected by a transmission line that is not illustrated in FIG. 3.

The second chip 5 further includes a vertical scanning circuit (indicated as "VSCAN" in FIG. 3) 24 that sequentially scans the pixels 11 arranged in each row in the first chip 1.

The second chip 5 includes a digital signal processing circuit (hereinafter referred to as "digital front end (DFE)", as indicated in FIG. 3) 28. The DFE 28 performs various kinds of processing (including noise subtraction processing, and various corrections such as gain correction and offset correction) for a digital signal output from the buffer memory 25. The second chip 5 includes the two DFEs 28. One of the DFEs 28 processes a digital signal output from the plurality of buffer memories 25.

The ADC 21 of the present exemplary embodiment performs AD conversion of ramp-signal comparison type for comparing a ramp signal and a signal based on a signal generated by the photoelectric conversion unit 13. The second chip 5 includes a ramp signal generation unit 35 (indicated as "Ramp gen." in FIG. 3) that generates this ramp signal.

The second chip 5 includes a timing generator (TG) 30 that generates various control signals. The second chip 5 further includes a counter 31 that generates a count signal in Gray code to be used in the AD conversion of ramp-signal comparison type.

The second chip 5 includes a data interface unit (indicated as "data I/F" in FIG. 3) 36 that outputs the signal processed by the DFE 28 to the outside of the imaging device.

Figure 4A:
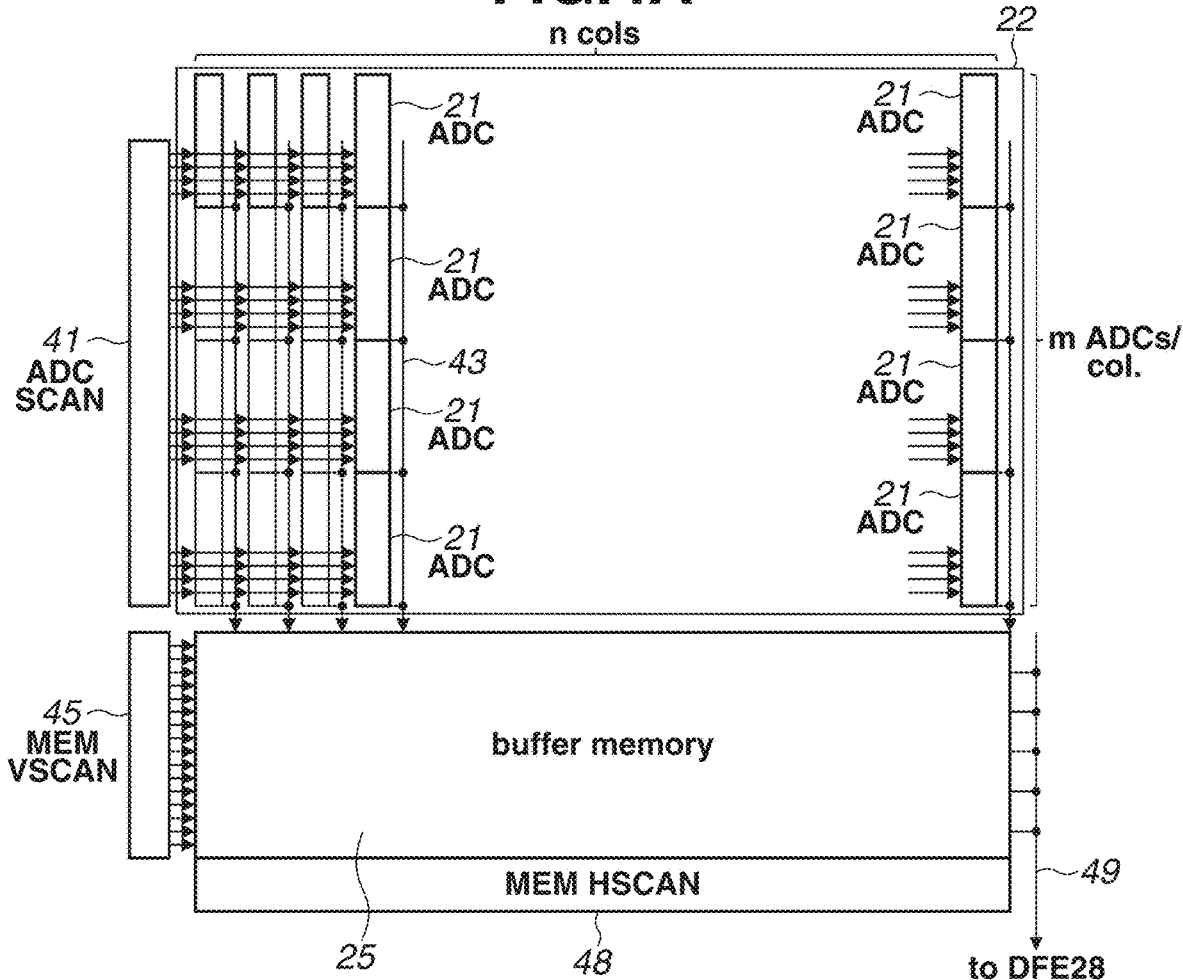
FIGS. 4A and 4B are a diagram illustrating a configuration of a partial region of the second chip, and a block diagram illustrating a configuration of an analog-to-digital (AD) conversion unit, respectively.

FIG. 4A is a block diagram illustrating details of a configuration concerning the one AD conversion region 22 and the one buffer memory 25.

The AD conversion region 22 includes the ADCs 21 in m-rows and n-columns, as the ADCs 21 for the plurality of rows and the plurality of columns.

The AD conversion region 22 includes a plurality of transmission lines 43 extending from the AD conversion region 22 to the buffer memory 25 provided outside the AD conversion region 22. The one transmission line 43 is connected to the ADCs 21 arranged for a plurality of rows and one column. In other words, the plurality of transmission lines 43 is arranged in the AD conversion region 22 so that each of the plurality of transmission lines 43 is connected to the ADCs 21 arranged in the plurality of rows and the one column.

Further, the second chip 5 includes an ADC scanning circuit (indicated as "ADC SCAN" in FIG. 4A) 41 that scans the ADCs 21 arranged in the plurality of rows and the plurality of columns, row by row. As will be described below, the ADC 21 includes a memory that holds a digital signal obtained by performing AD conversion of a signal corresponding to a signal of the photoelectric conversion unit 13. This memory is connected to the transmission line 43. The ADC scanning circuit 41 selects each of the memories of the respective ADCs 21 row by row. From the memory selected by the ADC scanning circuit 41, a digital signal held by this memory is output to the transmission line 43.

The signal output to the transmission line 43 is transmitted to the buffer memory 25 via the transmission line 43. As will be described below, in the buffer memory 25, memories (hereinafter each referred to as "bit memory") that each hold a signal of each bit (hereinafter referred to as "bit signal") of a digital signal formed of a plurality of bits are arranged in a plurality of rows and a plurality of columns. The second chip 5 includes a memory vertical scanning circuit (indicated as "MEM VSCAN" in FIG. 4A) 45 that vertically scans the buffer memory 25. The second chip 5 further includes a memory horizontal scanning circuit (indicated as "MEM HSCAN" in FIG. 4A) 48 that horizontally scans the buffer memory 25.

From the bit memory selected by the memory vertical scanning circuit 45 and the memory horizontal scanning circuit 48, the bit signal is transmitted to the DFE 28 via a transmission line 49.

Figure 4B:
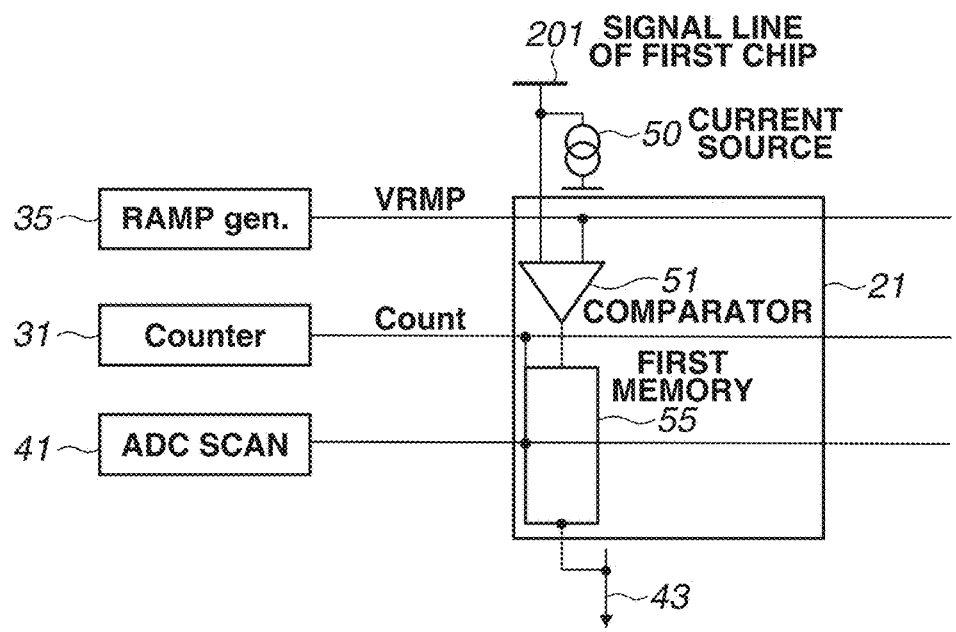

FIG. 4B is a block diagram illustrating a configuration of the ADC 21. The ADC 21 is connected to the signal line 201 illustrated in FIG. 2, via the connecting portion 3 illustrated in FIG. 1B. The connecting portion 3 connects the second chip 5 and the first chip 1. A current source 50 is provided in the second chip 5, and supplies an electric current to the signal line 201 illustrated in FIG. 2, via the connecting portion 3 illustrated in FIG. 1B. In this way, the amplification transistor 607 of the pixel 11 performs source follower operation. In other words, the current source 50 and the amplification transistor 607 form a source follower circuit.

The ADC 21 includes a comparator 51 and a first memory 55. To the comparator 51, a ramp signal VRMP is output from the ramp signal generation unit 35 illustrated in FIG. 3. The comparator 51 outputs a comparison result signal to the first memory 55. The comparison result signal indicates the result of a comparison between the ramp signal VRMP and the signal of the pixel 11 output from the signal line 201. To the first memory 55, a count signal Count is output from the counter 31 illustrated in FIG. 3. The count signal Count is a signal obtained by counting clock signals in Gray code. Based on the timing of occurrence of a change in the signal level of the comparison result signal, the first memory 55 holds the count signal Count at that moment. Each bit signal of the count signal Count is held by the corresponding bit memory of bit memories (first bit memories 55), and is each bit signal of a digital signal corresponding to a signal based on a signal generated by the photoelectric conversion unit 13.

In the present exemplary embodiment, the first memory 55 is included in the ADC 21. Accordingly, a memory area including the first memories 55 arranged in a plurality of rows and a plurality of columns is the AD conversion region 22 in the present exemplary embodiment.

To the first memory 55, a scanning signal is output from the ADC scanning circuit 41 illustrated in FIG. 4A. The first memory 55, to which the scanning signal in the active level is input, outputs the held digital signal to the transmission line 43.

Figure 5:
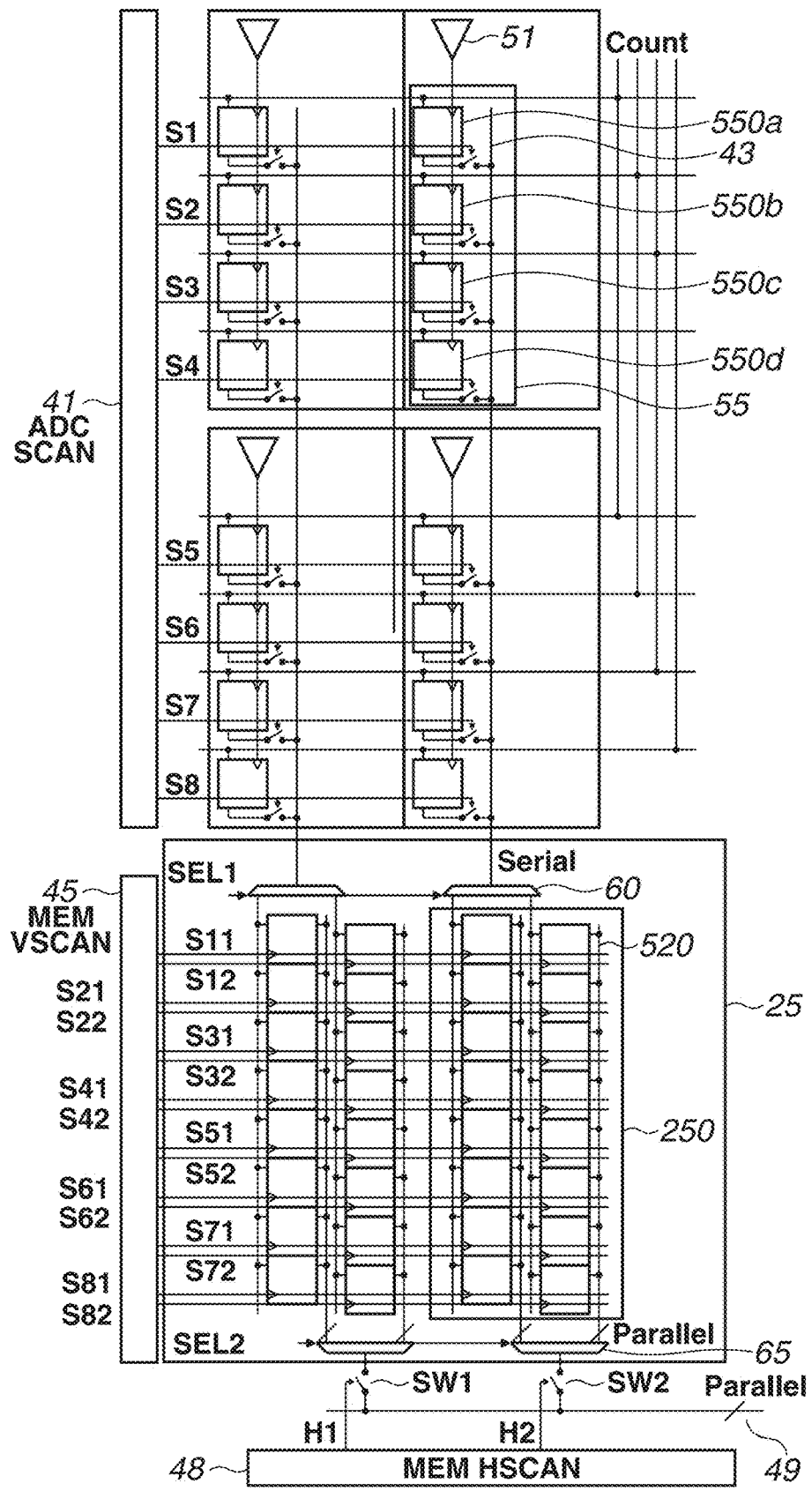
FIG. 5 is a block diagram illustrating a configuration of each of a first memory and a buffer memory.

FIG. 5 is a block diagram illustrating a configuration of one ADC 21 among the ADCs 21 illustrated in FIGS. 4A and 4B, and the buffer memory 25. Here, one ADC 21 among the ADCs 21 arranged in the plurality of rows and the plurality of columns will be mainly described. The other ADCs 21 each also have the same configuration as that of the ADC 21 to be described below.

The first memory 55 includes the first bit memories 550*a* to 550*d*. Each of the first bit memories 550*a* to 550*d* is a memory that holds a signal of each bit of the count signal Count. The comparison result signal of the comparator 51 is output to the first bit memories 550*a* to 550*d*.

Further, scanning signals S1 to S4 are input respectively to the first bit memories 550*a* to 550*d*, from the ADC scanning circuit 41. The ADC scanning circuit 41 is a first scanning circuit that scans the plurality of first bit memories 550*a* to 550*d* in a first direction (a forward direction in scanning rows). Furthermore, the one transmission line 43 is connected to the first bit memories 550*a* to 550*d*. In other words, the transmission line 43 is a first transmission line to which the plurality of first bit memories is connected. The ADC scanning circuit 41 sequentially brings the scanning signals S1 to S4 into the active level. Through this operation, the bit signals are output sequentially to the transmission line 43, starting from the first bit memory 550*a*. In other words, the transmission line 43 serially transmits the bit signals of the digital signal output by the one ADC 21.

Afterward, the ADC scanning circuit 41 sequentially brings scanning signals S5 to S8 into the active level. Through this operation, the bit signals of the digital signal of each of the ADCs 21 in a plurality of rows are thereby transferred serially to the one transmission line 43.

The buffer memory 25 includes a bit memory unit 250 in which second bit memories are arrayed. The buffer memory 25 further includes a first selector circuit 60 and a second selector circuit 65. A control signal SEL1 is input to the first selector circuit 60, from the TG 30 illustrated in FIG. 3.

Further, a control signal SEL2 is input to the second selector circuit 65, from the TG 30 illustrated in FIG. 3.

The bit memory unit 250 includes the second bit memories arranged in a plurality of columns, with respect to the ADCs 21 in one column. It can be said that, among the second bit memories in the plurality of columns, the second bit memories in a column are one memory group. It can also be said that the second bit memories in another column is another memory group. In other words, it can be said that the bit memory unit 250 includes a plurality of memory groups with respect to the ADCs 21 in one column. In a case where the control signal SEL1 is in the active level, the first selector circuit 60 transmits each of the bit signals transmitted from the transmission line 43, to one column of the second bit memories provided in the plurality of columns. In a case where the control signal SEL1 is in the non-active level, the first selector circuit 60 transmits each of the bit signals transmitted from the transmission line 43, to another column of the second bit memories provided in the plurality of columns.

The memory vertical scanning circuit 45 outputs a scanning signal Sxy (x is a value of any of 1 to 8, and y is a value of either 1 or 2) to the corresponding second bit memory. The memory vertical scanning circuit 45 is a second scanning circuit that scans the plurality of second bit memories 250*a* to 250*h* in the first direction (a forward direction in scanning rows).

The buffer memory 25 includes a transmission line group 520. As will be described in detail below, the transmission line group 520 includes a plurality of transmission lines.

The second bit memory, to which the scanning signal Sxy in the active level is input, holds the bit signal output from the first selector circuit 60.

In a case where the control signal SEL2 output from the TG 30 is in the active level, the second selector circuit 65 connects the transmission line group 520, to which the bit signals are to be transmitted from the one column of the second bit memories, to a switch SW2. On the other hand, in a case where the control signal SEL2 is in the non-active level, the second selector circuit 65 connects the transmission line group 520, to which the bit signals are to be transmitted from the other column of the second bit memories, to the switch SW2.

The memory horizontal scanning circuit 48 outputs a scanning signal Hw (w is an integer of any of 1 to n) to the corresponding switch SWw (w is an integer of any of 1 to n). The memory horizontal scanning circuit 48 sequentially brings the scanning signals Hw into the active level, starting from the scanning signal Hi. Through this operation, the bit signals are output to a transmission line group 49, sequentially from the switch SW1. The memory horizontal scanning circuit 48 is a third scanning circuit that scans a second transmission line and a third transmission line included in each of a plurality of sets.

Figure 6:
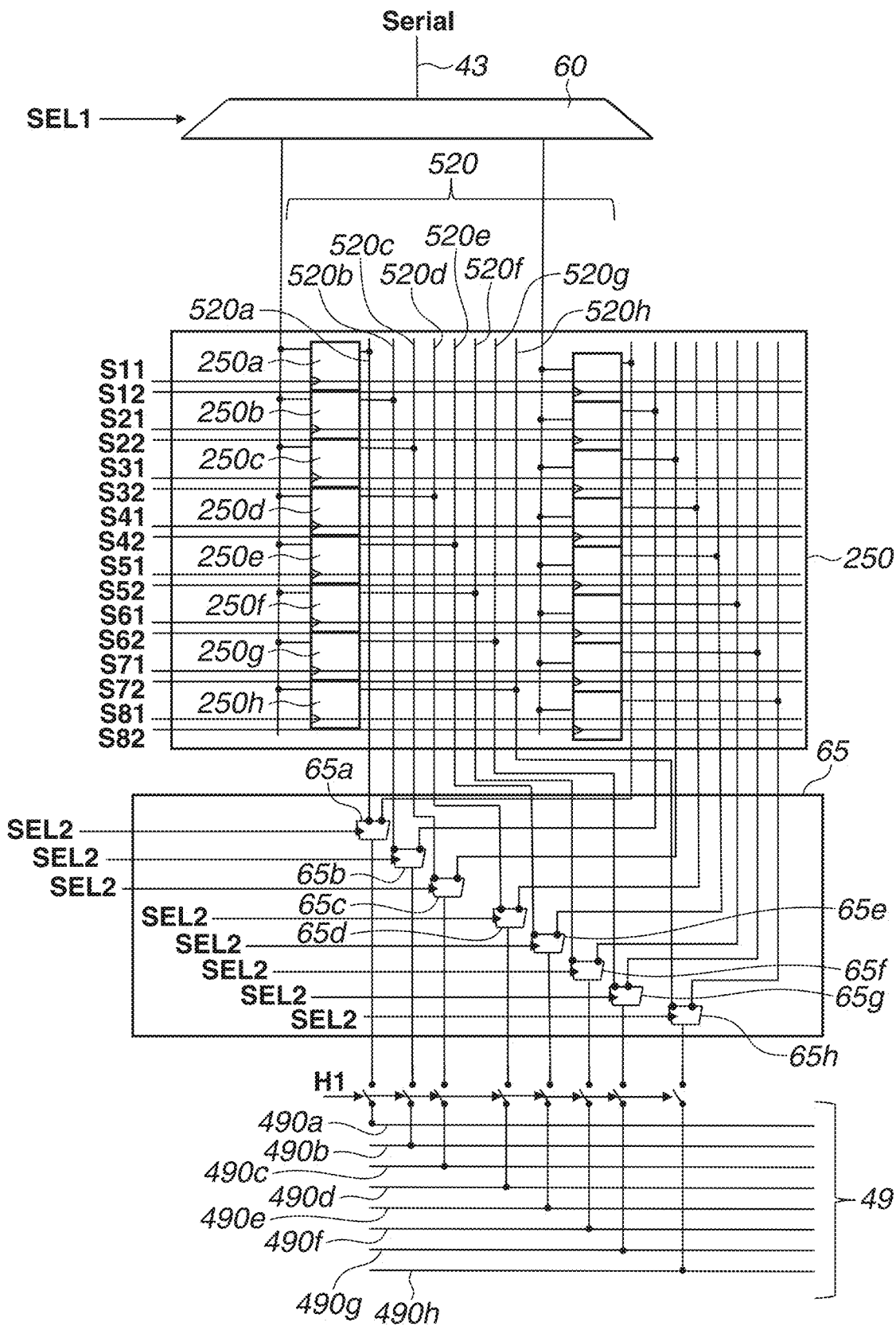
FIG. 6 is a diagram illustrating a configuration of the buffer memory.

FIG. 6 is a diagram illustrating details of the buffer memory 25 illustrated in FIG. 5. The transmission line group 520 includes transmission lines 520*a* to 520*h*. Further, the bit memory unit 250 includes the second bit memories 250*a* to 250*h*. The second bit memory 250*a* is connected to the transmission line 520*a*. Similarly, each of the second bit memories 250*b* to 250*h* is connected to the corresponding transmission line 520*z* (z is any of b to h) among the transmission lines 520*b* to 520*h*. For example, the transmission line 520*a* is the second transmission line to which the second bit memory 250*a* that is a second bit memory of a part of the plurality of second bit memories 250*a* to 250*h* is connected. Further, the transmission line 520*b* is the third transmission line to which the second bit memory 250*b* that is a second bit memory of another part of the plurality of second bit memories 250*a* to 250*h* is connected.

The second selector circuit 65 includes selector circuits 65*a* to 65*h* arranged to correspond to the transmission lines 520*a* to 520*h*, respectively. The transmission line group 49 includes transmission lines 490*a* to 490*h*. Each of the selector circuits 65*a* to 65*h* is connected to the corresponding transmission line of the transmission lines 490*a* to 490*h*, via the corresponding switch SW. The transmission line 490*a* is a fourth transmission line to which the second transmission line of one memory group of a plurality of memory groups or the second transmission line of another memory group of the plurality of memory groups is selectively connected. Further, the transmission line 490*b* is a fifth transmission line to which the third transmission line of the one memory group of the plurality of memory groups or the third transmission line of the another memory group of the plurality of memory groups is selectively connected.

Figure 7:
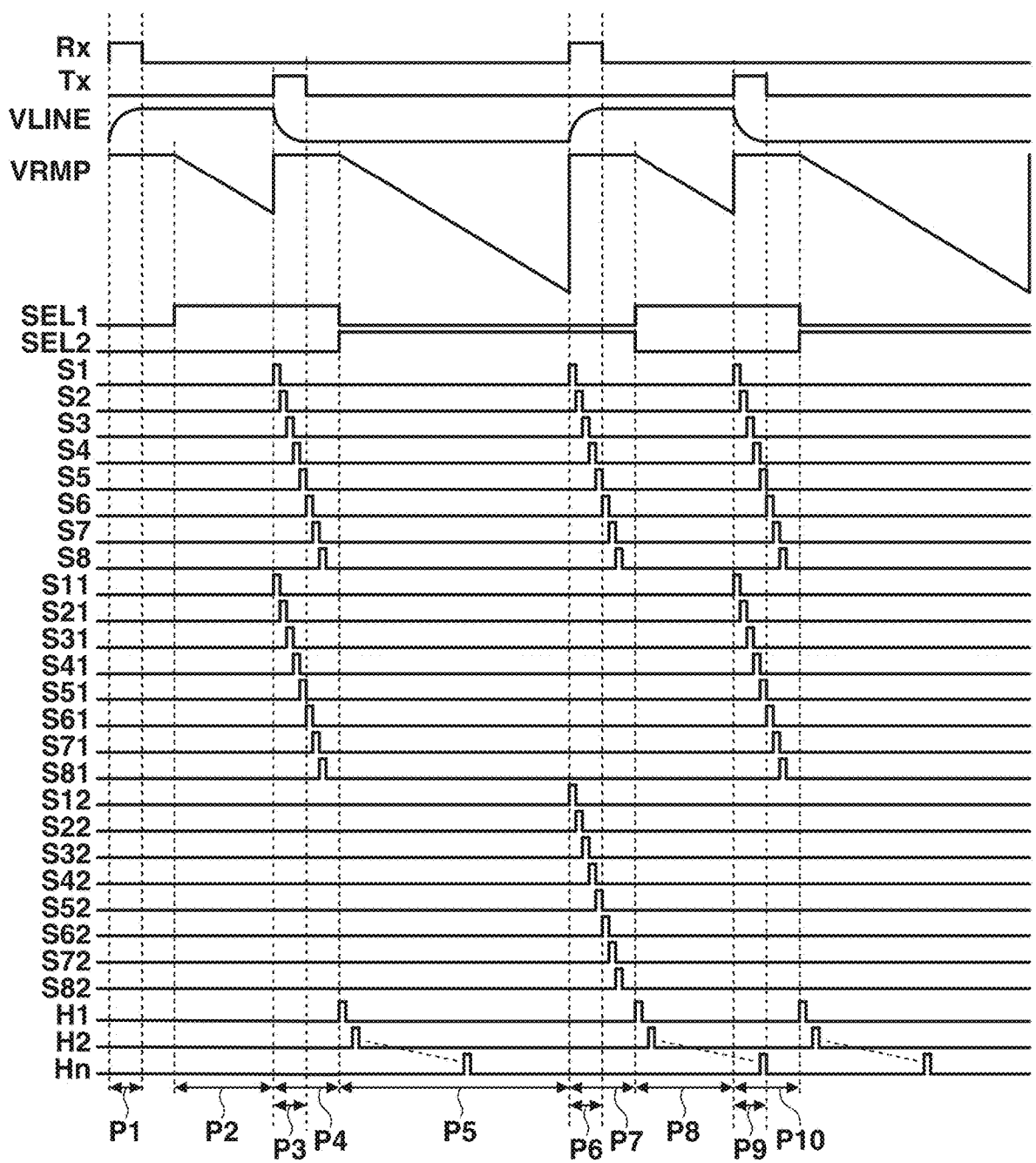
FIG. 7 is a diagram illustrating operation of the imaging device.

FIG. 7 is a timing chart illustrating operation of the imaging device according to the present exemplary embodiment.

Signals illustrated in FIG. 7 correspond to the signals described with reference to FIG. 2 to FIG. 6. A potential VLINE illustrated in FIG. 7 indicates a potential of the signal line 201.

In a period P1, the vertical scanning circuit 24 brings the signal Rx to be output to a pixel row that is to output a signal, into the active level. With this operation, the reset transistor 606 thereby becomes active, and the potential of the FD portion 605 is reset. A signal (noise signal) corresponding to the potential of the FD portion 605 whose reset is canceled is output from the amplification transistor 607 to the signal line 201, via the selection transistor 608.

In a period P2, the ramp signal generation unit 35 starts a monotonous change of the potential of the ramp signal VRMP. The monotonous change here indicates that the direction of the change of the potential remains unchanged, during a period from the start to the end of the change. In a case where a change occurs in the potential change rate per unit time of the ramp signal during the period from the start to the end of the change, this change is also within the range of the monotonous change of the potential.

In the period P2, each of the first bit memories 550*a* to 550*d* of the first memory 55 holds the count signal Count at the time a change in the signal level of the comparison result signal. This count signal Count is a digital signal based on the noise signal. This will be referred to as "data N".

In a period P4, the TG 30 keeps the control signal SEL1 to be output to the first selector circuit 60 in the active level. With this operation, the bit signals to be output from the first bit memories 550*a* to 550*d* are output to the transmission line that is connected to the first selector circuit 60 and the second bit memories 250*a* to 250*h* of the one column of the bit memory unit 250.

In the period P4, the ADC scanning circuit 41 sequentially brings the scanning signals S1 to S8 into the active level. In synchronization therewith, the memory vertical scanning circuit 45 sequentially brings the scanning signals S11, S21, S31, S41, S51, S61, S71, and S81 into the active level.

For example, in a case where the scanning signal S1 is in the active level, the scanning signal S11 is in the active level. The bit signal output by the first bit memory 550*a* is thereby held by the second bit memory 250*a* in the one column of the bit memory unit 250. Similarly, the bit signals of the data N held by the first memory 55 of the one ADC 21 are held by the second bit memories 250*a* to 250*d*. Further, the bit signals of the data N held by the first memory 55 of the ADC 21 in another row in the same column are held by the second bit memories 250*e* to 250*h*.

In a period P3 included in the period P4, the vertical scanning circuit 24 brings the signal Tx into the active level. With this operation, the electric charge generated in the photoelectric conversion unit 13 is transferred to the FD portion 605. As a result, the FD portion 605 has a potential corresponding to the electric charge generated by the photoelectric conversion unit 13. Accordingly, a signal (an optical signal) that corresponds to the potential of the FD portion 605 corresponding to the electric charge generated by the photoelectric conversion unit 13 is output from the amplification transistor 607 to the signal line 201, via the selection transistor 608.

As described above, the period P3 is included in the period P4. In other words, the operation for transmitting the bit signals from the first bit memories 550*a* to 550*d* to the second bit memories 250*a* to 250*h*, and the operation for transferring the electric charge from the photoelectric conversion unit 13 to the FD portion 605 are performed in parallel.

In a period P5, the ramp signal generation unit 35 starts a monotonous change of the potential of the ramp signal VRMP.

In the period P5, the first bit memories 550*a* to 550*d* of the first memory 55 each hold a corresponding bit of the count signal Count at the time of a change in the signal level of the comparison result signal. This count signal Count is a digital signal based on the optical signal. This will be referred to as "data S".

Further, in the period P5, the memory horizontal scanning circuit 48 sequentially brings the scanning signals Hw (w is an integer from 1 to n) into the active level. With this operation, the data N held by the second bit memories 250*a* to 250*h* in the one column of the bit memory unit 250 is output to the transmission line group 49.

In a period P7, the TG 30 keeps the control signal SEL2 to be outputted to the first selector circuit 60 in the active level. With this operation, the bit signals to be output from the first bit memories 550*a* to 550*d* are output to the transmission line that is connected to the first selector circuit 60 and the second bit memories 250*a* to 250*h* in the other column of the bit memory unit 250.

In the period P7, the ADC scanning circuit 41 sequentially brings the scanning signals S1 to S8 into the active level. In synchronism therewith, the memory vertical scanning circuit 45 sequentially brings the scanning signals S12, S22, S32, S42, S52, S62, S72, and S82 into the active level.

For example, in a case where the scanning signal S1 is in the active level, the scanning signal S12 is in the active level. With this operation, the bit signal output by the first bit memory 550*a* is held by the second bit memory 250*a* in the other column of the bit memory unit 250. Similarly, the bit signals of the data S held by the first memory 55 of the one ADC 21 are held by the second bit memories 250*a* to 250*d*. Further, the bit signals of the data S held by the first memory 55 of the ADC 21 in another row in the same column is held by the second bit memories 250*e* to 250*h*.

In a period P6 included in the period P7, the vertical scanning circuit 24 brings the signal Rx to be supplied to the next pixel row into the active level. With this operation, the reset transistor 606 in the next row becomes active, and the potential of the FD portion 605 is reset. To the signal line 201, the noise signal is output from the pixel 11 in the next row.

In a period P8 and a period P9, the memory horizontal scanning circuit 48 sequentially brings the scanning signals Hw (w is an integer from 1 to n) into the active level. With this operation, the data S held by the second bit memories 250a to 250h in the other column of the bit memory unit 250 is output to the transmission line group 49.

In a period P10 overlapping the period P9, as in the previous period P4, the bit signals of the data N held by the first memory 55 of the one ADC 21 are held by the second bit memories 250a to 250d. Further, the bit signals of the data N held by the first memory 55 of the ADC 21 in another row in the same column are held by the second bit memories 250e to 250h.

In other words, the operation for outputting the data S held by the second bit memories 250a to 250h in the other column of the bit memory unit 250 to the transmission line group 49 and the operation for outputting the data S from the first bit memories 550a to 550d to the second bit memories 250a to 250h can be performed in parallel. This is an effect produced by providing the second bit memories 250a to 250h in the plurality of columns, with respect to the first bit memories 550a to 550d in one column. In other words, this is because the plurality of second bit memories 250a is provided with respect to the first bit memory 550a, and the bit signal can be selectively output from this plurality of second bit memories 250a. This can reduce the waiting time for the transfer from the first bit memories 550a to 550d to the second bit memories 250a to 250h.

Further, in the present exemplary embodiment, serial transmission from the first bit memories 550a to 550d is performed by using the transmission line 43. On the other hand, parallel transmission from the second bit memories 250a to 250h is performed by using the transmission lines 520a to 520h and the transmission lines 490a to 490h. In this way, because the serial transmission of signals from the first bit memories 550a to 550d is performed, the wiring line area of the transmission lines in the AD conversion region 22 can be reduced. The AD conversion region 22 includes a circuit having many elements to perform the AD conversion. Accordingly, there is a case where the number of the ADCs is reduced if the region area of the AD conversion region 22 cannot be sufficiently secured. In this case, a period necessary to complete the AD conversion of the pixels 11 in a plurality of rows increases. Therefore, a sufficient number of ADCs can be secured, by reducing the wiring line area of the transmission lines that can increase the area of the ADCs.

Meanwhile, in the serial transmission, it takes a long time to transmit a digital signal formed of a plurality of bits, compared with the parallel transmission. Therefore, the parallel transmission is performed for the digital signals from the buffer memory 25 provided outside the AD conversion region. This can speed up the readout of the digital signals corresponding to the pixels 11 in the plurality of rows and the plurality of columns from the imaging device.

The high-speed readout of the digital signals by the parallel transmission causes signal fluctuations of the scanning signals, and noise due to signal fluctuations of the transmission lines. This noise causes a decline in the accuracy of the AD conversion, when propagating to the ADC. Specifically, if the noise disturbs on the power supply line of the comparator 51, the transmission line of the ramp signal VRMP, and the transmission line between the signal line 201 and the comparator 51, the timing of a change in the signal level of the comparison result signal becomes different from the timing of a change supposed to occur. For this reason, a digital signal having a value different from the value of a digital signal supposed to be obtained is acquired. In the imaging device according to the present exemplary embodiment, the buffer memory that performs noise parallel transmission is provided outside the AD conversion region 22. This can restrain a decline in the accuracy of the AD conversion.

In addition, in a case where the digital signal is transmitted from the AD conversion region 22 to the DFE 28 without the buffer memory 25 being provided, the following issue arises. In this case, it is assumed that a digital signal is read out by specifying an XY address, from the ADCs 21 of the plurality of rows and the plurality of columns. The AD conversion region 22 is provided with many elements for performing the AD conversion, including the comparator 51. Accordingly, in a case where a digital signal is transmitted from the AD conversion region 22 to the DFE 28, there is a large difference in distance between the ADC 21 having the longest transmission path to the DFE 28 and the ADC 21 having the shortest transmission path to the DFE 28. As a result, if the time for the transmission from the ADC 21 to the DFE 28 is determined based on the ADC 21 having the longest transmission distance, the time for the transmission of the digital signal from the AD conversion region 22 to the DFE 28 is long. On the other hand, if the time for the transmission from the ADC 21 to the DFE 28 is determined based on the ADC 21 having the shortest transmission distance, a failure occurs in the transmission of the digital signal from the AD conversion region 22 to the DFE 28.

On the other hand, in the present exemplary embodiment, the digital signals are transmitted from the ADCs 21 of the plurality of rows and the plurality of columns to the buffer memory 25 by the vertical scanning. In addition, the digital signals are transmitted to the DFE 28 by the vertical scanning and the horizontal scanning of the buffer memory 25. This can reduce the difference between the transmission distances of the digital signals from the respective ADCs 21 to the DFE 28. With this operation, it is possible to transmit the digital signal at a high speed, while keeping enough time for the transmission of the digital signal.

Figure 8:
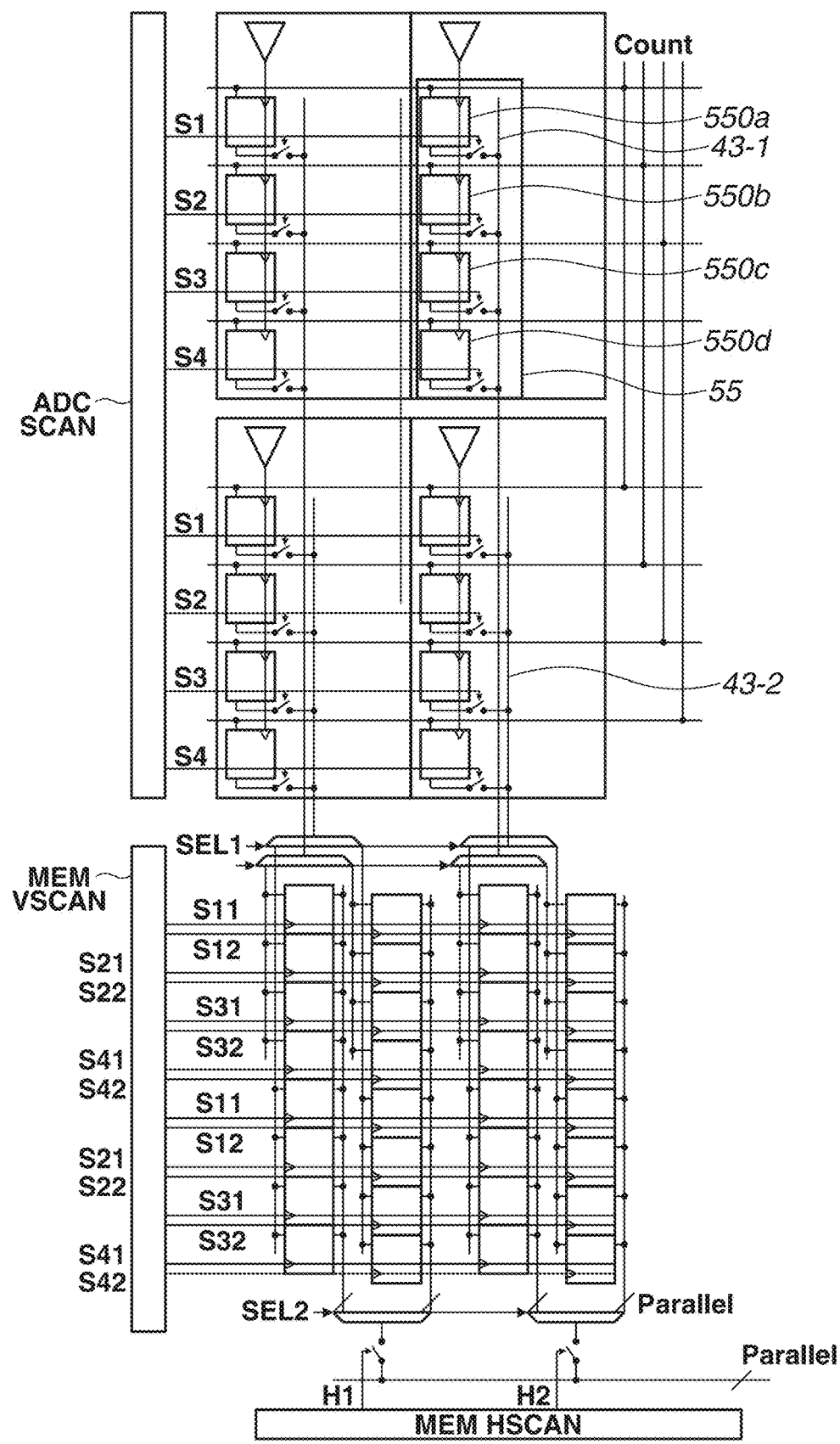
FIG. 8 is a diagram illustrating a configuration of each of the first memory and the buffer memory.

In the present exemplary embodiment, there is described the example in which the one transmission line 43 is provided for the ADCs 21 of the plurality of rows and one column, but the present exemplary embodiment is not limited thereto. For example, as illustrated in FIG. 8, there may be such a configuration that some of the ADCs 21 of the plurality of rows and one column are connected to a transmission line 43-1, while others of the ADCs 21 are connected to a transmission line 43-2. In this case, the bit signals can be transmitted in parallel, from the ADCs 21 in the plurality of rows to the buffer memory 25.

In the present exemplary embodiment, there is described the example in which one of the transmission lines 520a to 520h is provided to correspond to one of the corresponding second bit memories 250a to 250h, but the present exemplary embodiment is not limited thereto. In other words, there may be such a configuration that a plurality of second bit memories of a part of the second bit memories 250a to 250h is connected to the transmission line 520a (second transmission line), while a plurality of second bit memories of another part of the second bit memories 250a to 250h is connected to another transmission line that is the transmission line 520b (third transmission line). In this case, the bit signals are transmitted in parallel from some bit memories of the second bit memories and other bit memories of the second bit memories. In this way, an effect of speeding up the signal transmission from the buffer memory 25 to the DFE 28 can be obtained.

Further, in the present exemplary embodiment, there is described the example in which the ramp signal is used as an example of a reference signal to be input to the comparator 51. The present exemplary embodiment is not limited thereto. As another example of the reference signal, a reference signal to be used for AD conversion of successive approximation type may be adopted.

A second exemplary embodiment will be described focusing on a point different from the imaging device according to the first exemplary embodiment. In the imaging device according to the first exemplary embodiment, the first chip 1 and the second chip 5 are layered. In an imaging device according to the second exemplary embodiment, three chips of a first chip, a second chip, and a third chip are layered.

Figure 9:
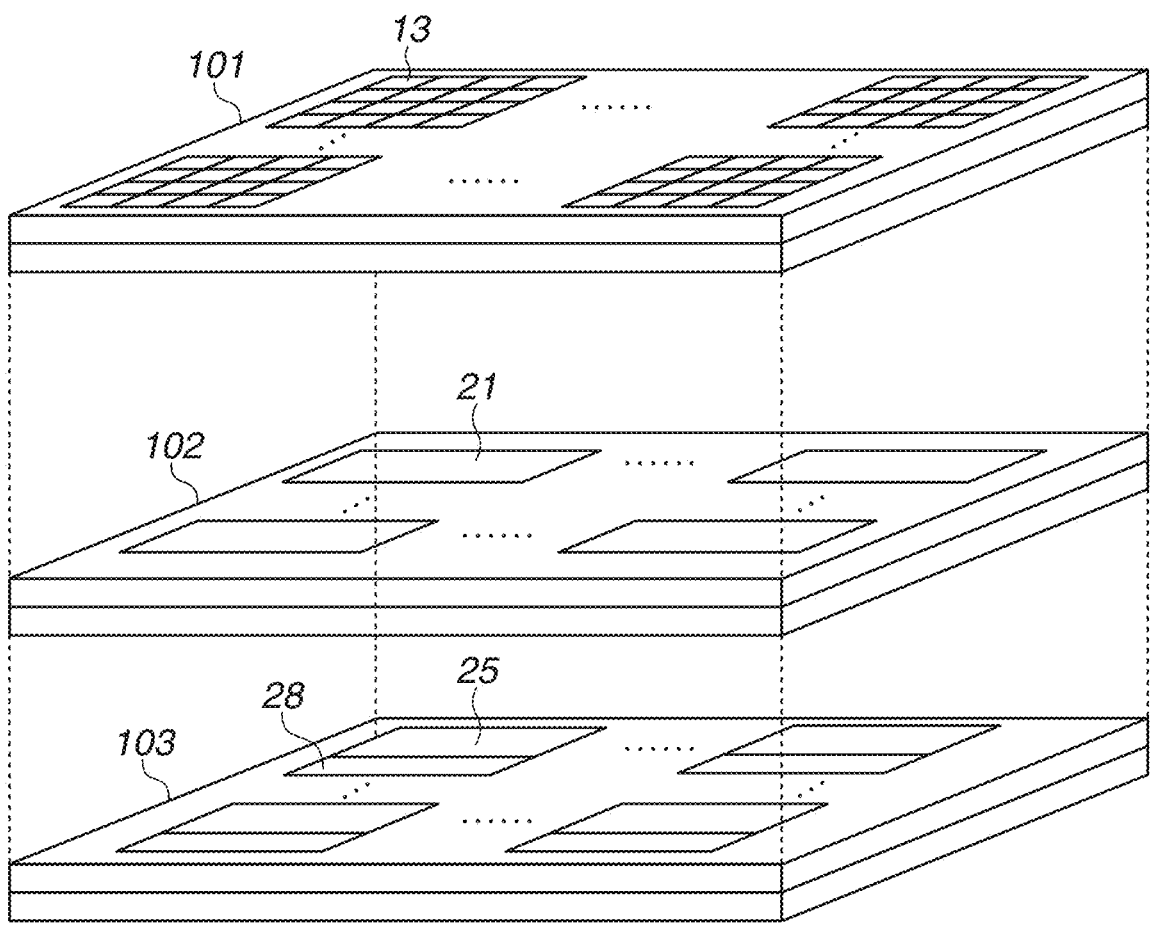
FIG. 9 is a schematic diagram illustrating a configuration of an imaging device.

FIG. 9 is a schematic diagram of the imaging device according to the present exemplary embodiment. A first chip 101, a second chip 102, and a third chip 103 are layered. In the first chip 101, photoelectric conversion units 13 are arranged in a plurality of rows and a plurality of columns.

In the second chip 102, ADCs 21 are arranged in a plurality of rows and a plurality of columns.

In the third chip 103, regions each including a buffer memory 25 and a DFE 28 are arranged in a plurality of rows and a plurality of columns.

Figure 10A:
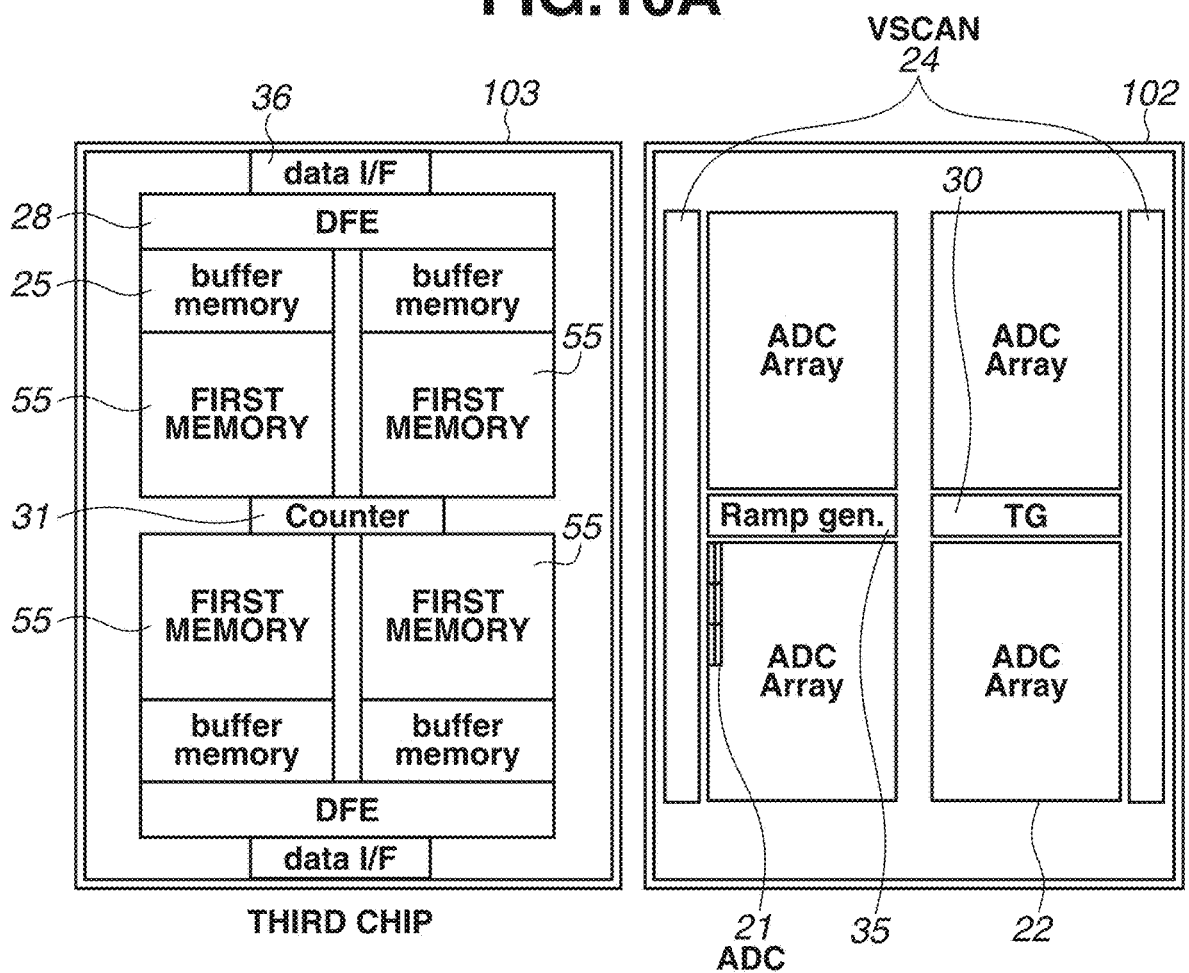
FIGS. 10A and 10B are a block diagram illustrating a configuration of a second chip, and a block diagram illustrating a configuration of an AD conversion unit, respectively.

FIG. 10A is a block diagram illustrating a configuration of the imaging device according to the present exemplary embodiment. In FIG. 10A, a block having the same function as that of the block illustrated in FIG. 3 is provided with the same reference numeral as that in FIG. 3. In the imaging device according to the present exemplary embodiment, a first memory 55 is provided outside the ADC 21. The first memory 55 is disposed in the third chip 103. In the present exemplary embodiment, the first memories 55 of a plurality of rows and a plurality of columns are disposed in a memory area that is different from an area for an AD conversion region 22.

Figure 10B:
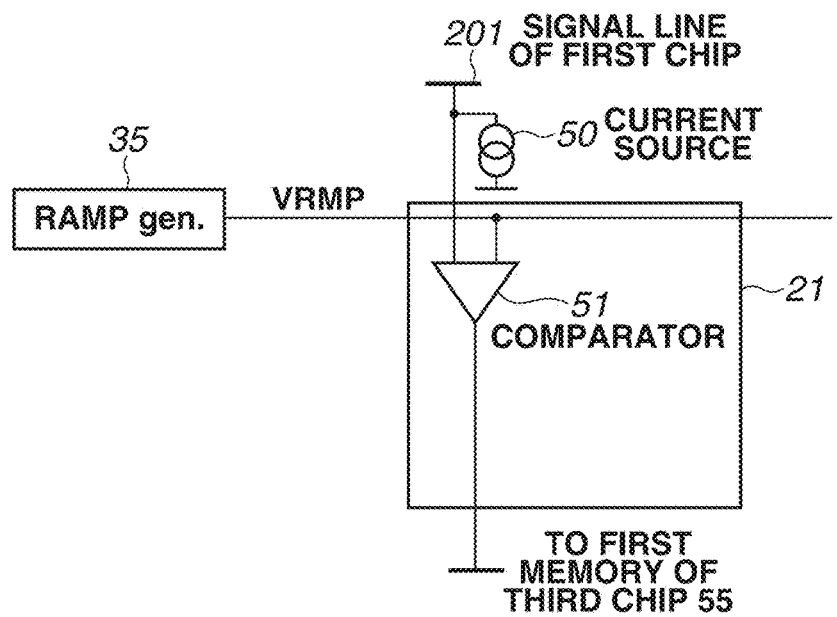

FIG. 10B is a block diagram illustrating a configuration concerning the ADC 21 of the present exemplary embodiment. Except that the first memory 55 is provided outside the ADC 21, the configuration in FIG. 10B can be similar to the configuration in FIG. 4B.

In the present exemplary embodiment, signal transmission between the first memory 55 and the buffer memory 25 and signal transmission between the buffer memory 25 and the DFE 28 can be similar to those in the first exemplary embodiment.

In this way, the imaging device according to the present exemplary embodiment can obtain an effect similar to that of the first exemplary embodiment, also in a case where the ADC 21 that includes a comparator 51 and the first memory 55 that receives an output of the ADC 21 are provided in different chips.

An imaging device according to a third exemplary embodiment will be described focusing on a point different from the first exemplary embodiment.

In the imaging device according to the present exemplary embodiment, a transistor (corresponding to the amplification transistor 607 in the first exemplary embodiment) having an input node connected to an FD portion 920 operates as an input transistor of a differential circuit included in a comparator.

Figure 11:
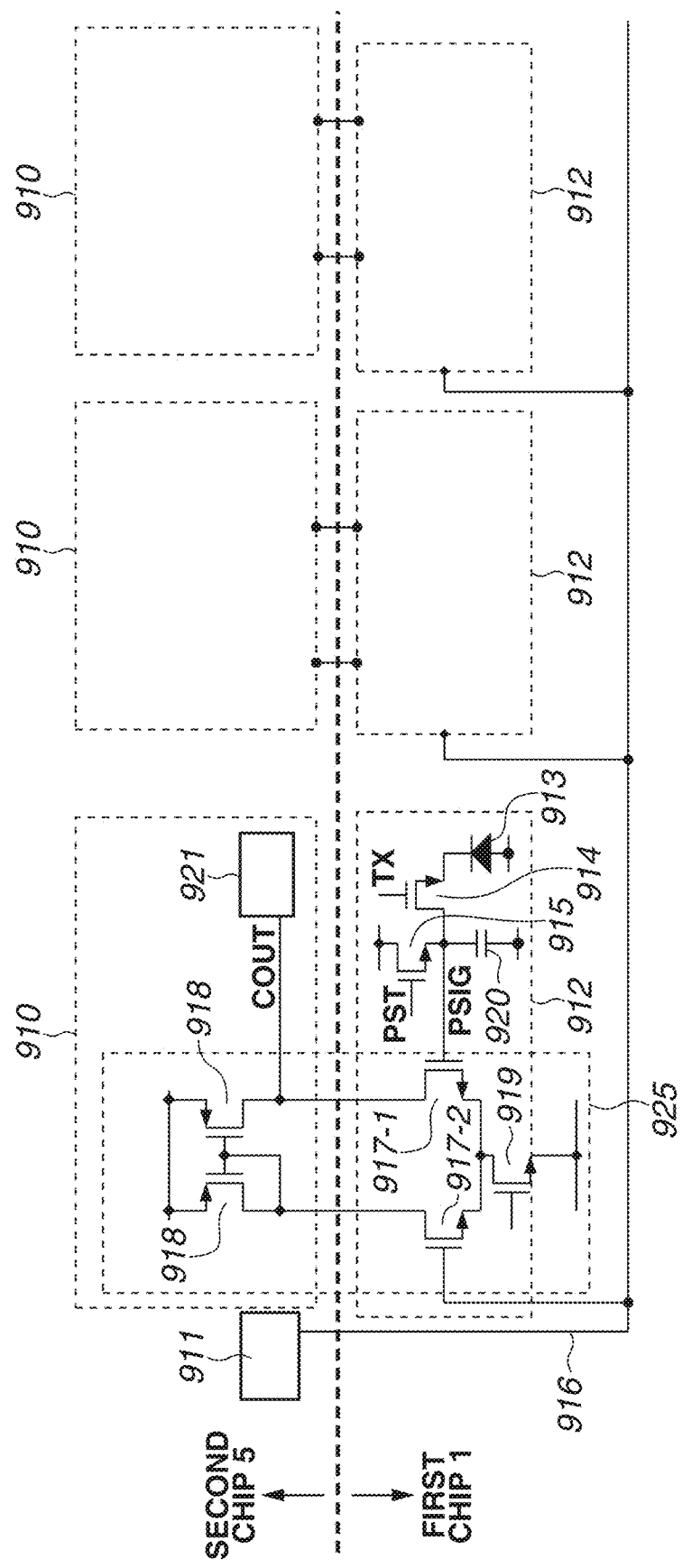
FIG. 11 is a diagram illustrating a configuration of an imaging device.

FIG. 11 is a circuit diagram illustrating a circuit of the imaging device according to the present exemplary embodiment.

In a first chip 1, a pixel 912 is disposed. The pixel 912 includes a photoelectric conversion unit (a photodiode) 913, a transfer transistor 914, a reset transistor 915, and an FD portion 920. The pixels 912 are arranged in a plurality of rows and a plurality of columns as illustrated in FIG. 11.

The pixel 912 further includes input transistors 917-1 and 917-2, and a current source 919.

In a second chip 5, a transistor group 918, a memory unit 921, and a ramp signal generation unit 911 are disposed. The transistor group 918 forms a current mirror circuit.

A power supply voltage Vdd is supplied to a common node of the transistor group 918. The input transistors 917-1 and 917-2 are connected to one main node of the current source 919. A power supply voltage GND (ground potential) is supplied to the other main node of the current source 919.

A differential circuit 925 is configured of the input transistors 917-1 and 917-2, the transistor group 918 forming the current mirror circuit, and the current source 919. The input transistors 917-1 and 917-2 are provided as a plurality of input nodes of the differential circuit 925. In the input transistor 917-1 of the differential circuit 925, the gate serving as a control node is connected to the FD portion 920. Because the input transistor 917-1 is connected to the photoelectric conversion unit 913 via the transfer transistor 914, it can be said that the input transistor 917-1 is an input node of the differential circuit 925, and this input node is connected to the photoelectric conversion unit 913.

Further, the gate serving as a control node of the input transistor 917-2 is connected to the ramp signal generation unit 911 via a transmission line 916. Accordingly, it can be said that the input transistor 917-2 is an input node of the differential circuit 925, and the ramp signal generation unit 911 is connected to this input node.

The input transistors 917-1 and 917-2, and the current source 919 that are a part of the differential circuit 925 are disposed in the first chip 1 where the photoelectric conversion unit 913 is disposed. On the other hand, the transistor group 918 that is the current mirror circuit and forms another part of the differential circuit 925 is disposed in the second chip 5. Further, in the present exemplary embodiment, the ramp signal generation unit 911 is disposed in the second chip 5 that is different from the first chip 1. In the first chip 1, the input transistors 917-1 and 917-2, the current source 919, and the photoelectric conversion unit 913 that are part of the differential circuit 925 are disposed.

The differential circuit 925 is a comparator that outputs a comparison result signal COUT. The comparison result signal COUT indicates the result of a comparison between the potential of the control node of the input transistor 917-1 and the potential of the control node of the input transistor 917-2. In other words, the comparator including the differential circuit 925 and the memory unit 921 form an ADC that converts an analog signal based on electric charge accumulated by the photoelectric conversion unit 913 into a digital signal.

The memory unit 921 of the present exemplary embodiment can be a first memory 55 described in the first exemplary embodiment. A buffer memory 25 is provided in a stage subsequent to the first memory 55, as in the first exemplary embodiment. A DFE 28 is provided in a stage subsequent to the buffer memory 25.

Signal transmission between the first memory 55 and the buffer memory 25 and signal transmission between the buffer memory 25 and the DFE 28 can be similar to those in the first exemplary embodiment.

Also in a case where the input transistor having the input node to which the FD portion (floating diffusion portion) is connected is the input transistor of the differential circuit as in the present exemplary embodiment, an effect similar to that of the imaging device according to the first exemplary embodiment can be obtained.

In each of the exemplary embodiments described above, rolling shutter operation is described. In the rolling shutter operation, the starts of the electric charge accumulation periods of the pixels vary among rows, and the ends thereof vary among rows as well. However, the global shutter operation in each of the exemplary embodiments described above can be performed as follows. In this global shutter operation, the starts of the electric charge accumulation periods of the pixels are the same for a plurality of rows and a plurality of columns, and the ends thereof are the same as well.

Figure 12:
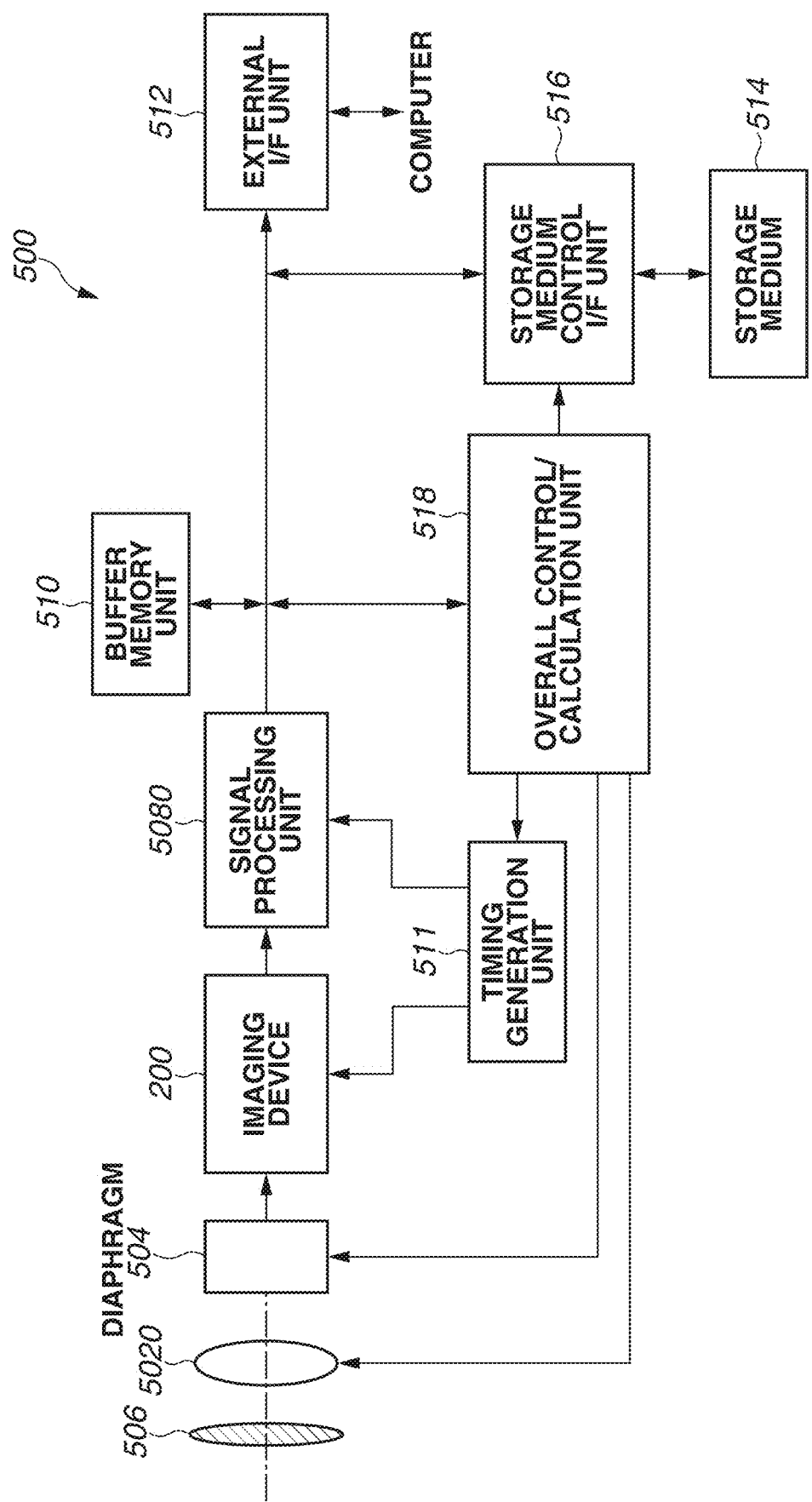
FIG. 12 is a diagram illustrating an entire imaging system.

FIG. 12 is a block diagram illustrating a configuration of an imaging system 500 according to a fourth exemplary embodiment. The imaging system 500 according to the present exemplary embodiment includes an imaging device 200 to which the configuration of the imaging device according to any one of the above-described exemplary embodiments is applied. Specific examples of the imaging system 500 include a digital still camera, a digital camcorder, and a monitor camera. FIG. 12 illustrates a configuration example of a digital still camera in which the imaging device according to any one of the above-described exemplary embodiments is applied to the imaging device 200.

The imaging system 500 of the example illustrated in FIG. 12 includes the imaging device 200, a lens 5020, a diaphragm 504, and a barrier 506. The lens 5020 is provided to focus an optical image of an object on the imaging device 200. The diaphragm 504 is provided to vary the quantity of light passing through the lens 5020. The barrier 506 is provided to protect the lens 5020. The lens 5020 and the diaphragm 504 form an optical system that condenses light on the imaging device 200.

The imaging system 500 further includes a signal processing unit 5080 that processes an output signal output from the imaging device 200. The signal processing unit 5080 performs signal processing operation. Specifically, the signal processing unit 5080 performs various kinds of processing such as correction and compression on an input signal as necessary, and outputs the result of the processing. The signal processing unit 5080 may have a function of performing AD conversion processing on an output signal output from the imaging device 200. In this case, it is not necessary to provide an A/D conversion circuit within the imaging device 200.

The imaging system 500 further includes a buffer memory unit 510 for temporarily storing image data, and an external interface unit (external I/F unit) 512 for communicating with an external computer. The imaging system 500 further includes a storage medium 514 such as a semiconductor memory, and a storage medium control interface unit (storage medium control I/F unit) 516. The storage medium 514 is provided for recording and reading out of the captured-image data. The storage medium control I/F unit 516 is provided for recording to and reading out from the storage medium 514. The storage medium 514 may be built in the imaging system 500, or may be attachable and removable.

The imaging system 500 further includes an overall control/calculation unit 518 and a timing generation unit 511. The overall control/calculation unit 518 performs various arithmetic operations, and controls the entire digital still camera. The timing generation unit 511 outputs various timing signals to the imaging device 200 and the signal processing unit 5080. The timing signals may be input from outside. The imaging system 500 only needs to have at least the imaging device 200, and the signal processing unit 5080 that processes an output signal output from the imaging device 200. The overall control/calculation unit 518 and the timing generation unit 511 may be configured to perform part or all of the control function of the imaging device 200.

The imaging device 200 outputs an image signal to the signal processing unit 5080. The signal processing unit 5080 outputs image data after performing predetermined signal processing on the image signal output from the imaging device 200. Further, the signal processing unit 5080 generates an image, using the image signal.

It is possible to implement an imaging system that can obtain an image of higher quality, by configuring the imaging system, using an imaging device based on the imaging device according to each of the exemplary embodiments described above.

An imaging system and a moving body according to a fifth exemplary embodiment will be described with reference to FIGS. 13A, 13B, and FIG. 14.

Figure 13A:
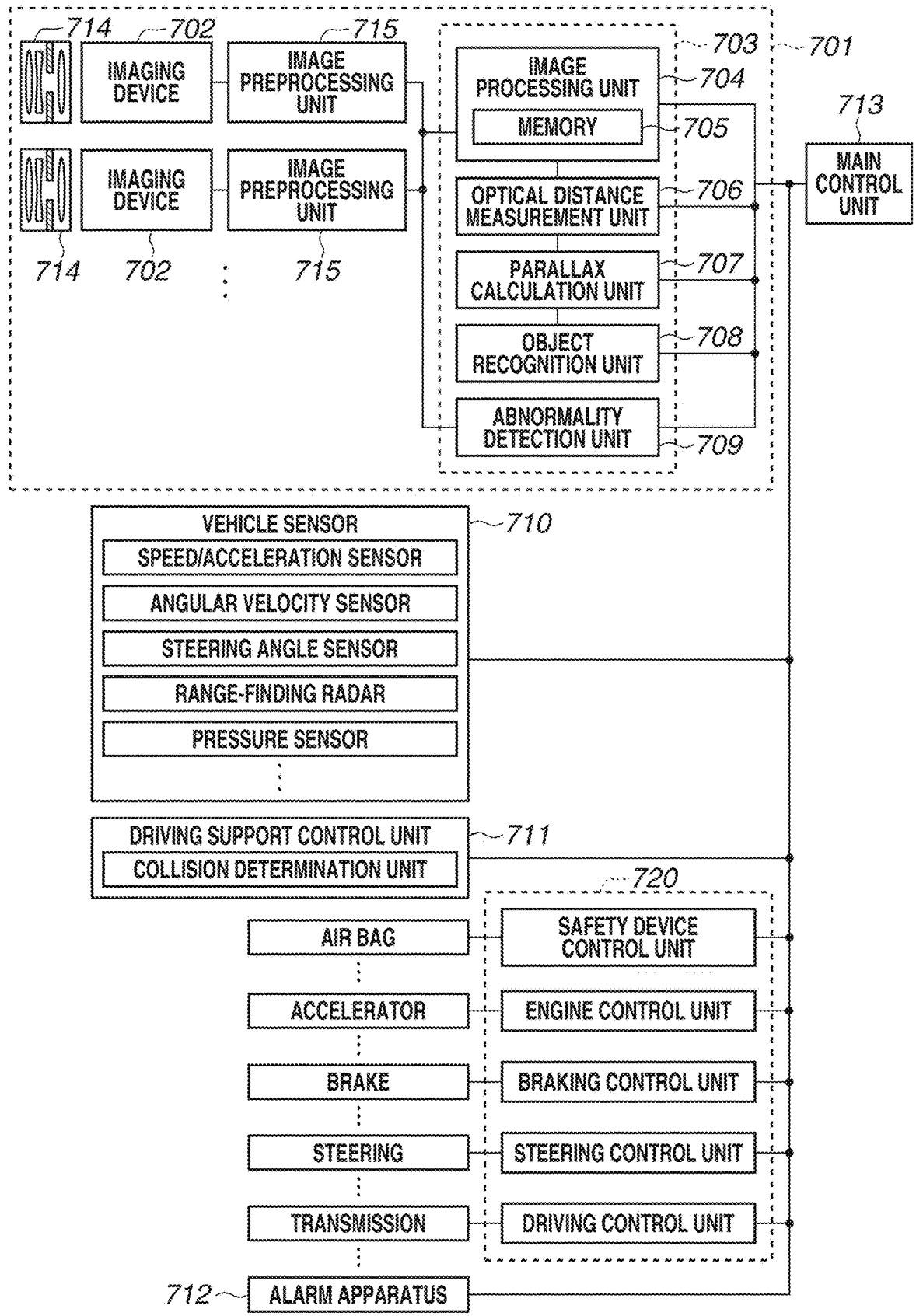
FIGS. 13A and 13B are diagrams each illustrating an entire moving body.
Figure 13B:
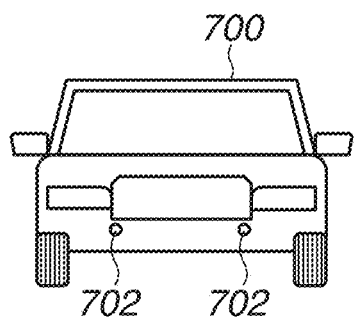
Figure 13B:
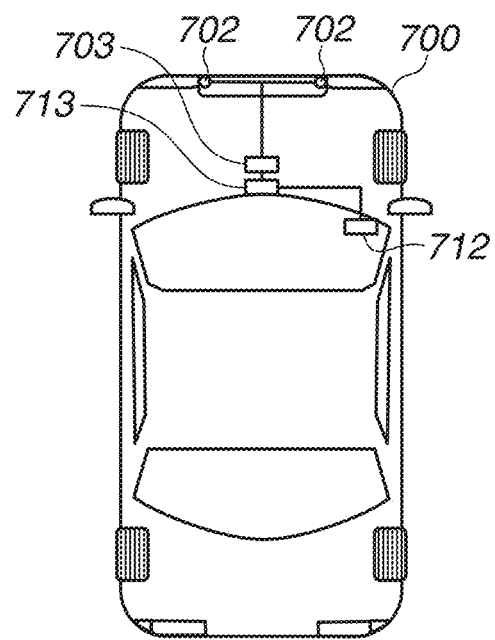
Figure 13B:
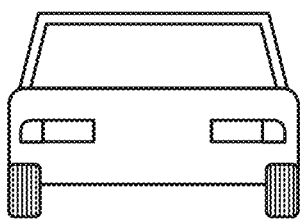
Figure 14:
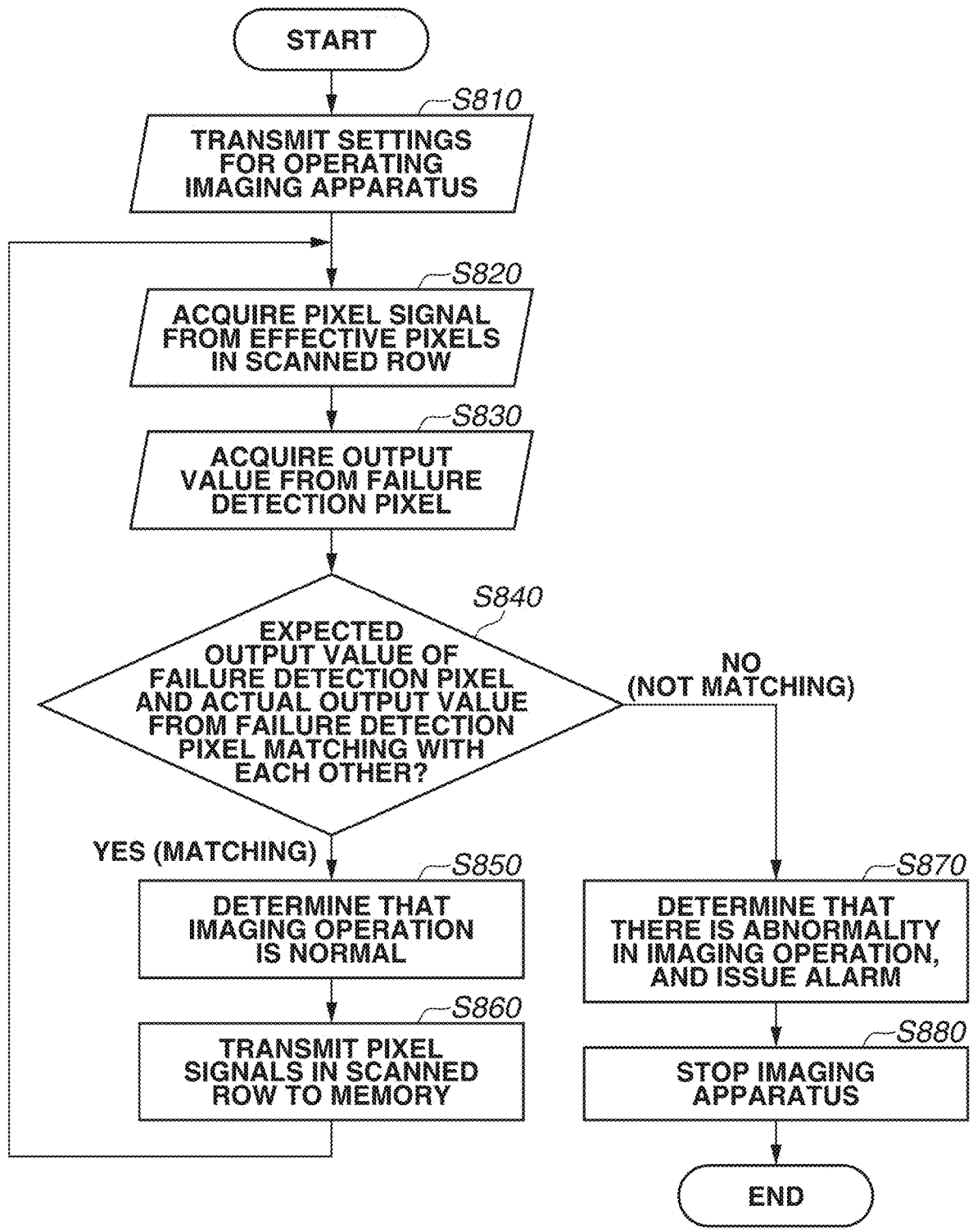
FIG. 14 is a flowchart illustrating a signal processing flow of an imaging system.

FIGS. 13A and 13B are a schematic diagram illustrating a configuration example of the imaging system and a schematic diagram illustrating a configuration example of the moving body, respectively, according to the present exemplary embodiment. FIG. 14 is a flowchart illustrating operation of the imaging system according to the present exemplary embodiment.

In the present exemplary embodiment, an example of an imaging system related to an on-vehicle camera will be described. FIGS. 13A and 13B illustrate an example of a vehicle system and an example of an imaging system installed on this vehicle system. An imaging system 701 includes imaging devices 702, image preprocessing units 715, an integrated circuit 703, and optical systems 714. The optical system 714 focuses an optical image of an object on the imaging device 702. The imaging device 702 converts the optical image of the object focused by the optical system 714 into an electric signal. The imaging device 702 is the imaging device according to any one of the above-described exemplary embodiments. The image preprocessing unit 715 performs predetermined signal processing for a signal output from the imaging device 702. The function of the image preprocessing unit 715 may be incorporated into the imaging device 702. The imaging system 701 is provided with at least two sets each including the optical system 714, the imaging device 702, and the image preprocessing unit 715. An output from the image preprocessing unit 715 of each set is to be input to the integrated circuit 703.

The integrated circuit 703 is an integrated circuit used for an imaging system. The integrated circuit 703 includes an image processing unit 704, an optical distance measurement unit 706, a parallax calculation unit 707, an object recognition unit 708, and an abnormality detection unit 709. The image processing unit 704 includes a memory 705. The image processing unit 704 performs image processing such as development processing and defect correction processing, on an output signal of the image preprocessing unit 715. The memory 705 is provided for primary storage of an image obtained by imaging. The memory 705 also stores a defect position of an imaging pixel. The optical distance measurement unit 706 performs focusing and measuring a distance of an object. The parallax calculation unit 707 calculates a parallax (phase difference of parallax images) from a plurality of pieces of image data acquired by the plurality of imaging devices 702. The object recognition unit 708 recognizes an object such as a car, a road, a sign, or a person. In a case where the abnormality detection unit 709 detects an abnormality of the imaging device 702, the abnormality detection unit 709 notifies a main control unit 713 of the detected abnormality.

The integrated circuit 703 may be implemented by an exclusively designed piece of hardware, or may be implemented by a software module, or may be implemented by a combination thereof. The integrated circuit 703 may also be implemented by a field programmable gate array (FPGA) or an application specific integrated circuit (ASIC), or may be implemented by a combination thereof.

The main control unit 713 comprehensively controls operations of components such as the imaging system 701, a vehicle sensor 710, and a control unit 720. Other types of method may be adopted. For example, the main control unit 713 may not be provided, and the imaging system 701, the vehicle sensor 710, and the control unit 720 may each have a communication interface to transmit and receive control signals via a communication network (e.g., the Controller Area Network (CAN) standard).

The integrated circuit 703 includes a function of transmitting a control signal and a setting value to the imaging device 702, upon receiving a control signal from the main control unit 713, or based on the own control unit. For example, the integrated circuit 703 transmits settings such as a setting for pulse-driving a voltage switch provided inside the imaging device 702, and a setting for changing the voltage switch for each frame.

The imaging system 701 is connected to the vehicle sensor 710. The imaging system 701 can detect driving conditions of the own vehicle, such as a vehicle speed, a yaw rate, and a steering angle. The imaging system 701 can also detect an environment outside the own vehicle, and the states of other vehicles and obstacles. The vehicle sensor 710 also serves as a distance information acquisition unit that acquires distance information about a distance from parallax images to a target object. Further, the imaging system 701 is connected to a driving support control unit 711 that provides various kinds of driving support, such as automatic steering, automatic traveling, and a collision prevention function. In particular, concerning a collision determination function, a collision with another car or an obstacle is presumed, or the presence/absence of a collision is determined, based on a detection result of the imaging system 701 or the vehicle sensor 710. Avoidance control in a case where a collision is presumed and safety device activation at the time of a collision are thereby performed.

The imaging system 701 is also connected to an alarm apparatus 712 that gives an alarm to a driver based on a result of determination by a collision determination unit. For example, in a case where there is a high possibility of occurrence of a collision as a result of determination by the collision determination unit, the main control unit 713 performs vehicle control for avoiding a collision or reducing damage, by, for example, braking, release an accelerator pedal, or restraining an engine output. The alarm apparatus 712 warns a user, by, for example, giving an audible alarm, displaying information on a display unit screen of a meter panel or car navigation system, or vibrating a seat belt or steering.

In the present exemplary embodiment, the imaging system 701 captures an image of a surrounding area, e.g., a frontward or backward area, of the vehicle. FIG. 13B illustrates a layout example of the imaging system 701 in a case where the imaging system 701 images the frontward area of the vehicle.

The two imaging devices 702 are disposed at the front of a vehicle 700. Specifically, assuming that the centerline with respect to forward and backward movement directions or an external form (e.g., a vehicle width) of the vehicle 700 is a symmetric axis, the two imaging devices 702 are disposed to be symmetric about the symmetric axis. This is desirable in terms of acquisition of information indicating a distance between the vehicle 700 and a target object, and determination of a possibility of collision. Further, it is desirable that the imaging device 702 is disposed at a position not to obstruct the view field of a driver when the driver visually recognizes a situation in the outside of the vehicle 700 from the driver seat. It is desirable that the alarm apparatus 712 is disposed at a position that easily enters the view field of the driver.

Next, failure detection operation of the imaging device 702 in the imaging system 701 will be described with reference to FIG. 14. The failure detection operation of the imaging device 702 is performed by steps S810 to S880 illustrated in FIG. 14.

In step S810, setting at the startup of the imaging device 702 is performed. In other words, from an external apparatus (e.g., main control unit 713) of the imaging system 701 or an internal unit of the imaging system 701, settings for operating the imaging device 702 are transmitted and the imaging operation and the failure detection operation of the imaging device 702 are started.

Next, in step S820, pixel signals are acquired from effective pixels in a scanned row. In step S830, an output value is acquired from a failure detection pixel provided for failure detection. This failure detection pixel includes a photoelectric conversion unit as with the effective pixel. A predetermined voltage is written in this photoelectric conversion unit. The failure detection pixel outputs a signal corresponding to the voltage written in this photoelectric conversion unit. Steps S820 and S830 may be reversed.

Next, in step S840, it is determined whether an expected output value of the failure detection pixel and an actual output value from the failure detection pixel match with each other.

In a case where the expected output value and the actual output value match with each other as a result of the determination in step S840 (YES in step S840), the processing proceeds to step S850. In step S850, it is determined that the imaging operation is normally performed. Then, the processing proceeds to step S860. In step S860, the pixel signals in the scanned row are transmitted to the memory 705, and the transmitted pixel signals are temporarily saved. Then, the processing returns to step S820, and the failure detection operation continues.

On the other hand, in a case where the expected output value and the actual output value do not match with each other as a result of the determination in step S840 (NO in step S840), the processing proceeds to step S870. In step S870, it is determined that there is an abnormality in the imaging operation, and an alarm is issued to the main control unit 713 or the alarm apparatus 712. The alarm apparatus 712 displays information indicating that the abnormality is detected, on a display unit. Then, in step S880, the imaging device 702 is stopped, and the operation of the imaging system 701 is ended.

In the present exemplary embodiment, there is described the example in which the flowchart loops row by row. However, the flowchart may loop for every plurality of rows, or the failure detection operation may be performed for each frame.

In step S870, the alarm may be issued to an external apparatus of the vehicle via a wireless network.

Further, in the present exemplary embodiment, the control for preventing a collision with another vehicle is described. However, the present exemplary embodiment is applicable to a control for performing automatic driving following another vehicle, and a control for performing automatic driving to prevent running over a lane. The imaging system 701 is applicable not only to a vehicle such as a private car, but also to, for example, a moving body (moving apparatus) such as a ship, an airplane, or an industrial robot. In addition, the imaging system 701 is applicable not only to a moving body, but also to an apparatus that utilizes object recognition in a wide range, such as an intelligent transport system (ITS).

Modified Exemplary Embodiments

The present invention can be modified in various ways, without being limited to the exemplary embodiments described above.

An example in a partial configuration of any one of the exemplary embodiments is added to one of the other exemplary embodiments is also an exemplary embodiment of the present invention. An example in which a partial configuration of any one of the exemplary embodiments is replaced with a partial configuration of one of the other exemplary embodiments is also an exemplary embodiment of the present invention.

Further, all of the above-described exemplary embodiments are only examples to realize the present invention. The technical scope of the present invention is not to be interpreted restrictively by these examples. In other words, the present invention can be implemented in various aspects, not deviating from the technical ideas or the substantial characteristics thereof.

The exemplary embodiments of the present invention can each provide a technique for speeding up the transmission of a digital signal formed of a plurality of bits, while suppressing an increase in the number of wiring lines of a transmission line.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A circuit comprising:
a first circuit area including a first group including a plurality of analog-to-digital (AD) conversion units configured to convert an analog signal to a digital signal, and a first memory group including a plurality of memories configured to hold the digital signal output from the first group;
a second circuit area including a second group including a plurality of AD conversion units configured to convert an analog signal to a digital signal, and a second memory group including a plurality of memories configured to hold the digital signal output from the second group; and
a counter configured to output a count signal to both of the plurality of AD conversion units in the first group and the plurality of AD conversion units in the second group,
wherein the counter is arranged between the first circuit area and the second circuit area.

2. The circuit according to claim 1, further comprising:
a first line, a second line, and a third line configured to transmit the count signal,
wherein the first line is connected to AD conversion units and the second line is connected to another AD conversion units, each of the AD conversion units and said another AD conversion units being included in the plurality of AD conversion units arranged in the first group, and
wherein the third line is connected to the first line and the second line.

3. The circuit according to claim 2, further comprising:
a scanning circuit configured to scan the plurality of AD conversion units in the first group and sequentially read the digital signal from the plurality of AD conversion units,
wherein the AD conversion units to which the first line is connected is connected to the scanning circuit by a first scanning line, and
wherein said another AD conversion units to which the second line is connected is connected to the scanning circuit by a second scanning line.

4. The circuit according to claim 1, further comprising:
a first digital signal processing circuit configured to process the digital signal,
wherein the first group is arranged in a region between the counter and the first digital signal processing circuit.

5. The circuit according to claim 4, further comprising:
a first interface circuit configured to output a signal out of the circuit,
wherein the first digital signal processing circuit is arranged between the first interface circuit and the first group.

6. The circuit according to claim 4, wherein the first memory group is arranged between the first group and the first digital signal processing circuit.

7. The circuit according to claim 4, further comprising:
a second digital signal processing circuit configured to process the digital signal,
wherein the second group is arranged in a region between the counter and the second digital signal processing circuit.

8. The circuit according to claim 7, further comprising:
a second interface circuit configured to output a signal out of the circuit,
wherein the second digital signal processing circuit is arranged between the second interface circuit and the second group.

9. The circuit according to claim 7, wherein a second memory group including a plurality of memories configured to hold the digital signal is arranged between the second group and the second digital signal processing circuit.

10. The circuit according to claim 4,
wherein the circuit further includes a third group and a fourth group in each of which a plurality of AD conversion units is arranged in a plurality of row and a plurality of columns, and
wherein a ramp signal generation circuit configured to generate a ramp signal is arranged between the third group and the fourth group.

11. The circuit according to claim 10, wherein the third group is arranged between the ramp signal generation circuit and the first digital signal processing circuit.

12. The circuit according to claim 7,
wherein the circuit further includes a third group and a fourth group in each of which a plurality of AD conversion units is arranged in a plurality of row and a plurality of columns, and
wherein a ramp signal generation circuit configured to generate a ramp signal is arranged between the third group and the fourth group.

13. The circuit according to claim 12, wherein the fourth group is arranged between the ramp signal generation circuit and the second digital signal processing circuit.

14. The circuit according to claim 10,
wherein the circuit includes a second scanning circuit configured to scan a plurality of analog output circuits configured to output the analog signal, and
wherein the third group is arranged between the second scanning circuit and the first group.

15. The circuit according to claim 14, wherein the fourth group is arranged between the second scanning circuit and the second group.

16. The circuit according to claim 10, wherein a third memory group including a plurality of memories configured to hold the digital signal is arranged between the third group and the first digital signal processing circuit.

17. The circuit according to claim 6,
wherein the circuit further includes a third group and a fourth group in each of which a plurality of AD conversion units is arranged,
wherein a third memory group including a plurality of memories configured to hold the digital signal is arranged between the third group and the first digital signal processing circuit,
wherein the circuit includes a second scanning circuit configured to scan a plurality of analog output circuits configured to output the analog signal, and
wherein the third memory group is arranged between the second scanning circuit and the first memory group.

18. The circuit according to claim 17, further comprising:
a second digital signal processing circuit configured to process the digital signal,
wherein the second group is arranged in a region between the counter and the second digital signal processing circuit,
wherein the second memory group is arranged between the second group and the second digital signal processing circuit,
wherein a fourth memory group including a plurality of memories configured to hold the digital signal is arranged between the fourth group and the second digital signal processing circuit, and
wherein the fourth memory group is arranged between the second scanning circuit and the second memory group.

19. The circuit according to claim 1, wherein the plurality of AD conversion units of the first group is arranged in a plurality of row and a plurality of columns, and the plurality of AD conversion units of the second group is arranged in a plurality of row and a plurality of columns.

20. The circuit according to claim 1, wherein the counter is arranged between the first memory group and the second memory group.

21. The circuit according to claim 1, further comprising:
a first digital signal processing circuit configured to process the digital signal, and
a second digital signal processing circuit configured to process the digital signal,
wherein the counter is arranged between the first digital signal processing circuit and the second digital signal processing circuit.

22. A chip comprising:
a first circuit area including a first group including a plurality of analog-to-digital (AD) conversion units configured to convert an analog signal to a digital signal, and a first memory array including a plurality of memories configured to hold the digital signal output from the first group;
a second circuit area including a second group including a plurality of AD conversion units configured to convert an analog signal to a digital signal, and a second memory group including a plurality of memories configured to hold the digital signal output from the second group; and
a counter configured to output a count signal to both of the plurality of AD conversion units in the first group and the plurality of AD conversion units in the second group,
wherein the counter is arranged between the first circuit area and the second circuit area.

23. An imaging apparatus including a chip on which the circuit according to claim 1 is arranged and another chip including a photoelectric conversion unit configured to output the analog signal to the chip being stacked.

24. An imaging system comprising:
the imaging apparatus according to claim 23; and
a signal processing unit configured to process a signal output by the imaging apparatus.

25. A moving body including the imaging apparatus according to claim 23,
wherein the moving body further includes a control unit configured to control movement of the moving body.

26. A circuit comprising:
a first array and a second array in each of which a plurality of analog-to-digital (AD) conversion units configured to convert an analog signal to a digital signal is arranged in a plurality of row and a plurality of columns;
a counter configured to output a count signal to both of the plurality of AD conversion units arranged in the first array and the plurality of AD conversion units arranged in the second array; and
a first memory array including a plurality of memories configured to hold the digital signal and arranged in a plurality of rows and a plurality of columns,
wherein the counter is arranged in a region between the first array and the second array in a planar view, and
wherein the first array is arranged between the first memory array and the counter.

27. The circuit according to claim 26, further comprising:
a first line, a second line, and a third line configured to transmit the count signal,
wherein the first line is connected to AD conversion units and the second line is connected to another AD conversion units, each of the AD conversion units and said another AD conversion units being included in the plurality of AD conversion units arranged in the first array, and
wherein the third line is connected to the first line and the second line.

28. The circuit according to claim 27, further comprising:
a scanning circuit configured to scan the AD conversion units and sequentially read the digital signal from the AD conversion units, wherein the AD conversion units to which the first line is connected is connected to the scanning circuit by a first scanning line, and wherein said another AD conversion units to which the second line is connected is connected to the scanning circuit by a second scanning line.

29. The circuit according to claim 26, further comprising:
a first digital signal processing circuit configured to process the digital signal,
wherein the first array is arranged in a region between the counter and the first digital signal processing circuit.

30. The circuit according to claim 29, further comprising:
a first interface circuit configured to output a signal out of the circuit,
wherein the first digital signal processing circuit is arranged between the first interface circuit and the first array.

31. The circuit according to claim 29, wherein the first memory array is arranged between the first array and the first digital signal processing circuit.

32. The circuit according to claim 29, further comprising:
a second digital signal processing circuit configured to process the digital signal,
wherein the second array is arranged in a region between the counter and the second digital signal processing circuit.

33. The circuit according to claim 32, further comprising:
a second interface circuit configured to output a signal out of the circuit,
wherein the second digital signal processing circuit is arranged between the second interface circuit and the second array.

34. The circuit according to claim 32, wherein a second memory array including a plurality of memories configured to hold the digital signal and arranged in a plurality of rows and a plurality of columns is arranged between the second array and the second digital signal processing circuit.

35. The circuit according to claim 29,
wherein the circuit further includes a third array and a fourth array in each of which a plurality of AD conversion units is arranged in a plurality of row and a plurality of columns, and
wherein a ramp signal generation circuit configured to generate a ramp signal is arranged between the third array and the fourth array.

36. The circuit according to claim 35, wherein the third array is arranged between the ramp signal generation circuit and the first digital signal processing circuit.

37. The circuit according to claim 32,
wherein the circuit further includes a third array and a fourth array in each of which a plurality of AD conversion units is arranged in a plurality of row and a plurality of columns, and
wherein a ramp signal generation circuit configured to generate a ramp signal is arranged between the third array and the fourth array.

38. The circuit according to claim 37, wherein the fourth array is arranged between the ramp signal generation circuit and the second digital signal processing circuit.

39. The circuit according to claim 35,
wherein the circuit includes a second scanning circuit configured to scan a plurality of analog output circuits each configured to output the analog signal, and
wherein the third array is arranged between the second scanning circuit and the first array.

40. The circuit according to claim 39, wherein the fourth array is arranged between the second scanning circuit and the second array.

41. The circuit according to claim 35, wherein a third memory array including a plurality of memories configured to hold the digital signal and arranged in a plurality of rows and a plurality of columns is arranged between the third array and the first digital signal processing circuit.

42. The circuit according to claim 31,
wherein the circuit further includes a third array and a fourth array in each of which a plurality of AD conversion units is arranged in a plurality of row and a plurality of columns,
wherein a third memory array including a plurality of memories configured to hold the digital signal and arranged in a plurality of rows and a plurality of columns is arranged between the third array and the first digital signal processing circuit,
wherein the circuit includes a second scanning circuit configured to scan a plurality of analog output circuits configured to output the analog signal, and
wherein the third memory array is arranged between the second scanning circuit and the first memory array.

43. The circuit according to claim 42, further comprising:
a second digital signal processing circuit configured to process the digital signal,
wherein the second array is arranged in a region between the counter and the second digital signal processing circuit,
wherein a second memory array including a plurality of memories configured to hold the digital signal and arranged in a plurality of rows and a plurality of columns is arranged between the second array and the second digital signal processing circuit,
wherein a fourth memory array including a plurality of memories configured to hold the digital signal and arranged in a plurality of rows and a plurality of columns is arranged between the fourth array and the second digital signal processing circuit, and
wherein the fourth memory array is arranged between the second scanning circuit and the second memory array.

44. The circuit according to claim 26, wherein each of the plurality of memories in the first memory array is connected to corresponding one of the plurality of AD conversion units arranged in the first array.

45. A chip comprising:
a first array and a second array in each of which a plurality of AD conversion units configured to convert an analog signal to a digital signal is arranged in a plurality of row and a plurality of columns;
a counter configured to output a count signal to both of the plurality of AD conversion units arranged in the first array and the plurality of AD conversion units arranged in the second array; and
a first memory array including a plurality of memories configured to hold the digital signal and arranged in a plurality of rows and a plurality of columns,
wherein the counter is arranged in a region between the first array and the second array, and
wherein the first array is arranged between the first memory array and the counter.

46. The chip according to claim 45, wherein each of the plurality of memories in the first memory array is connected to corresponding one of the plurality of AD conversion units arranged in the first array.

47. An imaging apparatus including a chip on which the circuit according to claim 26 is arranged and another chip including a photoelectric conversion unit configured to output the analog signal to the chip being stacked.

48. An imaging system comprising:
   the imaging apparatus according to claim 47; and
   a signal processing unit configured to process a signal output by the imaging apparatus.

49. A moving body including the imaging apparatus according to claim 47,
   wherein the moving body further includes a control unit configured to control movement of the moving body.

* * * * *